US012689121B2

(12) United States Patent
Kuo et al.

(10) Patent No.: US 12,689,121 B2
(45) Date of Patent: Jul. 21, 2026

(54) ANTENNA DEVICE

(71) Applicant: AUO Corporation, Hsinchu (TW)

(72) Inventors: Chia-Wei Kuo, Hsinchu (TW);
Ching-Lang Hung, Hsinchu (TW)

(73) Assignee: AUO Corporation, Hsinchu (TW)

( * ) Notice: Subject to any disclaimer, the term of this
patent is extended or adjusted under 35
U.S.C. 154(b) by 243 days.

(21) Appl. No.: 18/397,986

(22) Filed: Dec. 27, 2023

(65) Prior Publication Data

US 2025/0174887 A1 May 29, 2025

(30) Foreign Application Priority Data

Nov. 27, 2023 (TW) ................................. 112145761

(51) Int. Cl.
*H03K 17/00* (2006.01)
*H01Q 3/24* (2006.01)
*H01Q 23/00* (2006.01)
*H03K 17/56* (2006.01)
(52) U.S. Cl.
CPC ............... *H01Q 3/24* (2013.01); *H01Q 23/00*
(2013.01); *H03K 17/56* (2013.01)
(58) Field of Classification Search
CPC ........ H01Q 3/24; H01Q 23/00; H01Q 1/2283;
H01Q 1/528; H01Q 9/0414; H01Q
21/065; H03K 17/56
See application file for complete search history.

(56) References Cited

U.S. PATENT DOCUMENTS

| | | | |
|---|---|---|---|
| 11,126,229 B2 | 9/2021 | Chen et al. | |
| 2018/0182556 A1* | 6/2018 | Linn | H01Q 13/103 |
| 2022/0247075 A1* | 8/2022 | Jalili | H01Q 3/30 |
| 2023/0052527 A1* | 2/2023 | Jia | H01Q 3/36 |
| 2025/0237917 A1* | 7/2025 | Li | G02F 1/1313 |

FOREIGN PATENT DOCUMENTS

| | | |
|---|---|---|
| CN | 114336056 | 4/2022 |
| CN | 110764296 | 8/2022 |
| CN | 112490676 | 5/2023 |

* cited by examiner

*Primary Examiner* — Ping Y Hsieh
(74) *Attorney, Agent, or Firm* — JCIPRNET

(57) ABSTRACT

An antenna device includes a first substrate and first and
second antenna units disposed above the first substrate. The
first antenna unit includes a first transistor, a first lower
antenna electrode and a first upper antenna electrode. The
second antenna unit includes a second transistor, a second
lower antenna electrode, and a second upper antenna elec-
trode. A gate electrode, a source electrode and a drain
electrode of the first transistor are respectively symmetrical
to a gate electrode, a source electrode and a drain electrode
of the second transistor.

17 Claims, 16 Drawing Sheets

ANTENNA DEVICE

CROSS-REFERENCE TO RELATED APPLICATION

This application claims the priority benefit of Taiwan application serial no. 112145761, filed on Nov. 27, 2023. The entirety of the above-mentioned patent application is hereby incorporated by reference herein and made a part of specification.

BACKGROUND

Technical Field

The present invention relates to an antenna device.

Description of Related Art

With the commercialization of fifth-generation mobile networks (5G), applications such as telemedicine, VR live broadcast, 4K image quality live broadcast, and smart home are all facing new development opportunities. With its advantages of high data rate, low latency, energy saving, cost reduction, increased system capacity and support for large-scale device connections, 5G technology provides excellent performance to operators in various fields and promotes cross-industry cooperation to jointly create a new generation of 5G industrial chain. In order to improve the coverage of 5G millimeter wave, many manufacturers are committed to developing new antenna devices.

SUMMARY

The present invention provides an antenna device that can improve the interference issues caused by the transistor array and its control circuit on the antenna signal.

At least one embodiment of the present invention provides an antenna device, which includes a first substrate and a first antenna unit and a second antenna unit disposed above the first substrate. The first antenna unit includes a first transistor, a first lower antenna electrode and a first upper antenna electrode. The first lower antenna electrode is electrically connected to the first transistor. The first upper antenna electrode is at least partially overlapping with the first lower antenna electrode. The second antenna unit includes a second transistor, a second lower antenna electrode and a second upper antenna electrode. A gate electrode, a source electrode and a drain electrode of the first transistor are respectively symmetrical to a gate electrode, a source electrode and a drain electrode of the second transistor. The second lower antenna electrode is electrically connected to the second transistor. The second upper antenna electrode is at least partially overlapping with the second lower antenna electrode.

In some embodiments, the first lower antenna electrode is symmetrical to the second lower antenna electrode.

In some embodiments, the gate electrode, the source electrode and the drain electrode of the first transistor are respectively mirror symmetrical to the gate electrode, the source electrode and the drain electrode of the second transistor based on the external mirror symmetry axis.

In some embodiments, the first lower antenna electrode is mirror symmetrical to the second lower antenna electrode based on an external mirror symmetry axis.

In some embodiments, the first antenna unit includes a third transistor. A gate electrode, a source electrode and a drain electrode of the third transistor are respectively mirror symmetrical to the gate electrode, the source electrode and the drain electrode of the first transistor based on an internal mirror symmetry axis.

In some embodiments, the first lower antenna electrode has a mirror symmetry structure based on an internal mirror symmetry axis.

In some embodiments, the second antenna unit includes a fourth transistor. A gate electrode, a source electrode and a drain electrode of the fourth transistor are respectively mirror symmetrical to the gate electrode, the source electrode and the drain electrode of the third transistor based on an external mirror symmetry axis.

In some embodiments, the gate electrode, the source electrode and the drain electrode of the first transistor are configured to have a rotational symmetry with the gate electrode, the source electrode and the drain electrode of the second transistor based on an external rotational symmetry axis.

In some embodiments, the first antenna unit includes a third transistor. A gate electrode, a source electrode and a drain electrode of the third transistor are configured to have a rotational symmetry with the gate electrode, the source electrode and the drain electrode of the first transistor based on an internal rotational symmetry axis.

In some embodiments, the first lower antenna electrode has a rotationally symmetric structure based on an internal rotational symmetry axis.

In some embodiments, the gate of the first transistor and the gate of the second transistor are electrically connected to each other through a scan line.

In some embodiments, the antenna device further includes a metal mesh structure electrically connected with the first upper antenna electrode and the second upper antenna electrode.

In some embodiments, the antenna device further includes a barrier layer that is overlapping with the first transistor in the normal direction of a top surface of the first substrate. The barrier layer, the metal mesh structure and the first upper antenna electrode belong to a same layer.

In some embodiments, the antenna device further includes a second substrate, a third substrate, a fourth substrate, a third antenna unit and a spacer layer. The first antenna unit and the second antenna unit are located between the first substrate and the second substrate. The third antenna unit is disposed between the third substrate and the fourth substrate. The third antenna unit includes a third transistor, a third lower antenna electrode and a third upper antenna electrode. The third lower antenna electrode is electrically connected to the third transistor. The third upper antenna electrode is at least partially overlapping with the third lower antenna electrode. The gate electrode, the source electrode and the drain electrode of the first transistor are overlapping with a gate electrode, a source electrode and a drain electrode of the third transistor respectively. The spacer layer supports a distance between the first substrate and the third substrate so that there is an air gap between the first substrate and the third substrate.

In some embodiments, each of the first upper antenna electrode and the second upper antenna electrode includes a cross-shaped annular. The first antenna unit further includes a first common electrode surrounding the first upper antenna electrode. The second antenna unit further includes a second common electrode surrounding the second upper antenna electrode. The first common electrode and the second common electrode are integrated as one.

In some embodiments, each of the first upper antenna electrode and the second upper antenna electrode includes a cross-shaped annular. The first antenna unit further includes a first common electrode surrounding the first upper antenna electrode. The second antenna unit further includes a second common electrode surrounding the second upper antenna electrode. The first common electrode and the second common electrode are electrically connected to each other through a conductive line structure.

In some embodiments, the first lower antenna electrode includes multiple strip structures or multiple L-shaped structures.

At least one embodiment of the present invention provides an antenna device, which includes a first substrate, multiple data lines, multiple scan lines, and multiple antenna units. The data lines and scan lines are disposed above the first substrate. The antenna units are disposed above the first substrate. Each antenna unit includes a first transistor, a second transistor, a first lower antenna electrode and a first upper antenna electrode. The first transistor is electrically connected to a corresponding one of the data lines and a corresponding one of the scan lines. The second transistor is electrically connected to a corresponding other one of the data lines and a corresponding other one of the scan lines. A gate electrode, a source electrode and a drain electrode of the first transistor are respectively symmetrical to a gate electrode, a source electrode and a drain electrode of the second transistor. The first lower antenna electrode is electrically connected to the first transistor and the second transistor. The first upper antenna electrode is at least partially overlapping with the first lower antenna electrode.

In some embodiments, each antenna unit further includes a third transistor and a fourth transistor. The third transistor is electrically connected to the corresponding other one of the data lines and the corresponding one of the scan lines. The fourth transistor is electrically connected to the corresponding one of the data lines and the corresponding other one of the scan lines. A gate electrode, a source electrode and a drain electrode of the third transistor are respectively disposed symmetrically based on a gate electrode, a source electrode and a drain electrode of the fourth transistor.

In some embodiments, the first transistor and the second transistor are mirror symmetrical to the third transistor and the fourth transistor respectively.

DESCRIPTION OF THE EMBODIMENTS

In the embodiments described herein, "symmetry" includes the meanings of "mirror symmetry" and "rotation symmetry." It is worth mentioning that "symmetry" in this article covers the offset caused by process tolerances that can be understood by a person with ordinary skill in the art of the present invention. The offset range depends on the accuracy of the process equipment and may be several nanometers or micrometers.

It will be understood that, although the terms "first," "second," "third," etc. may be used herein to describe various elements, components, regions, layers and/or portions, these elements, components, regions and/or portions shall not be limited by these terms. These terms are only used to distinguish one of element, component, region, layer or portion from another of element, component, region, layer or portion. Therefore, "a first element", "a first component", "a first region", "a first layer" or "a first portion" discussed below could be termed a "a second element", "a second component", ""a second Area", "a second layer" or "a second portion" without departing from the teachings of this article.

Figure 1A:
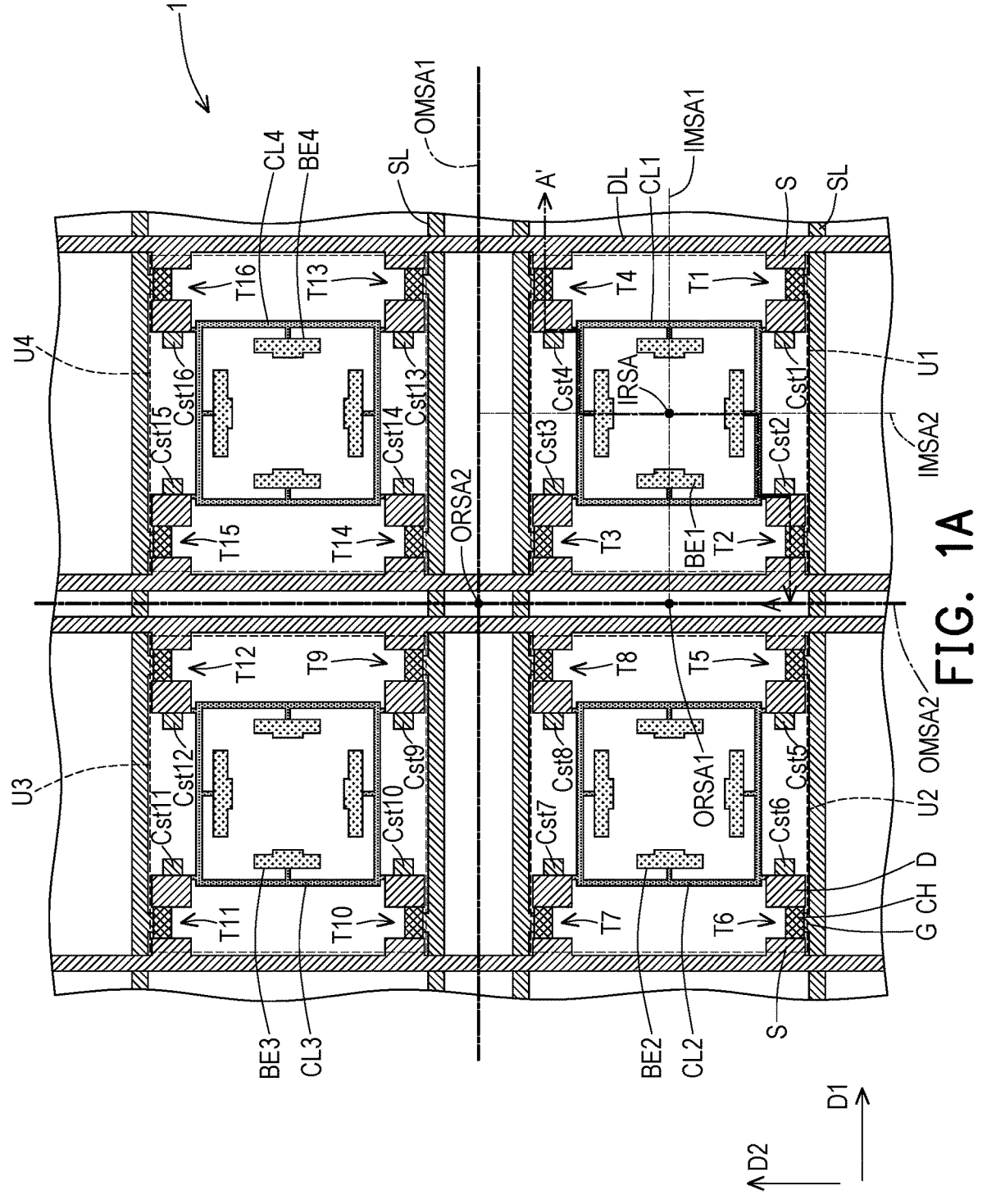
FIGS. 1A and 1B are schematic top views of an antenna device according to an embodiment of the present invention.
Figure 1B:
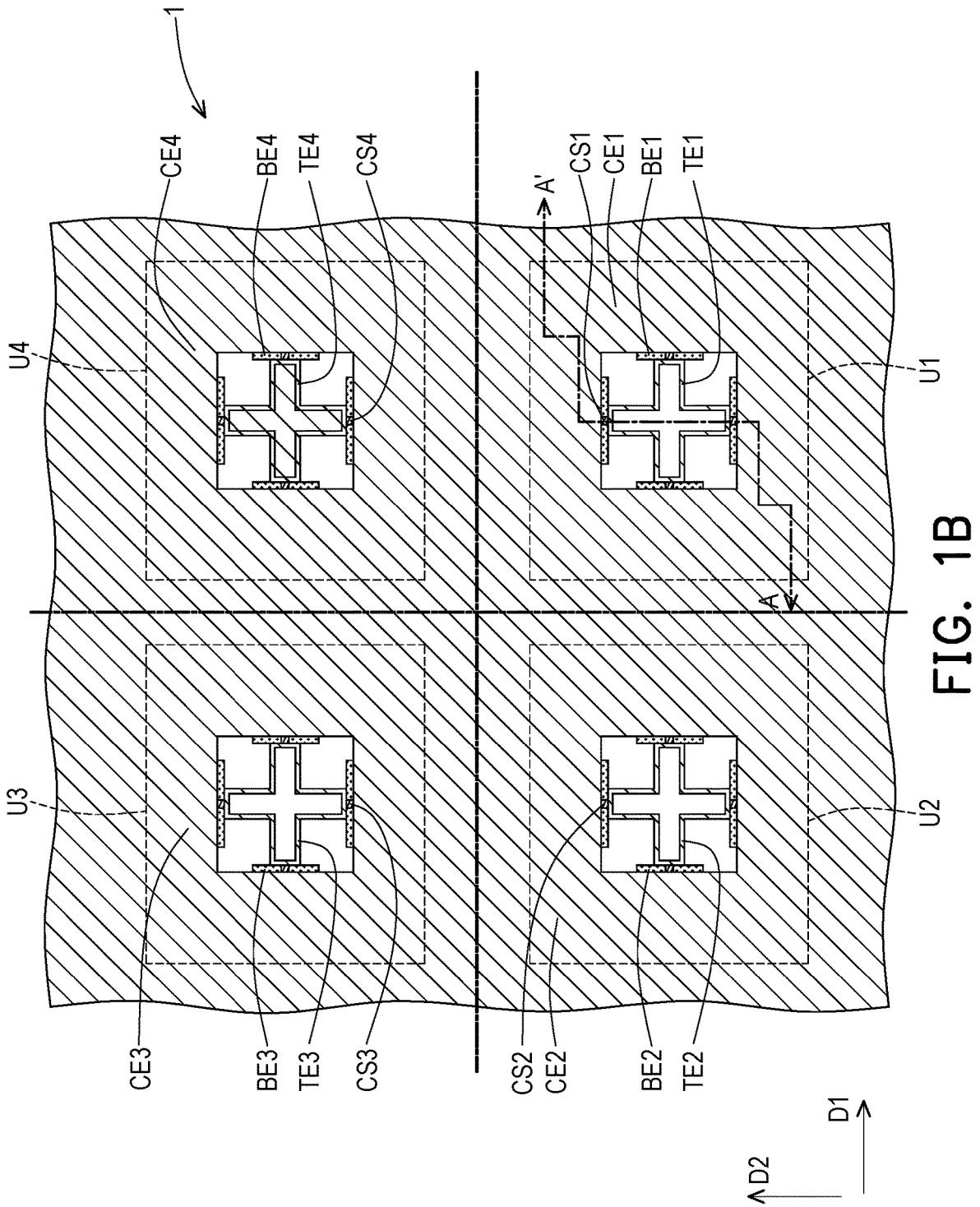
Figure 2:
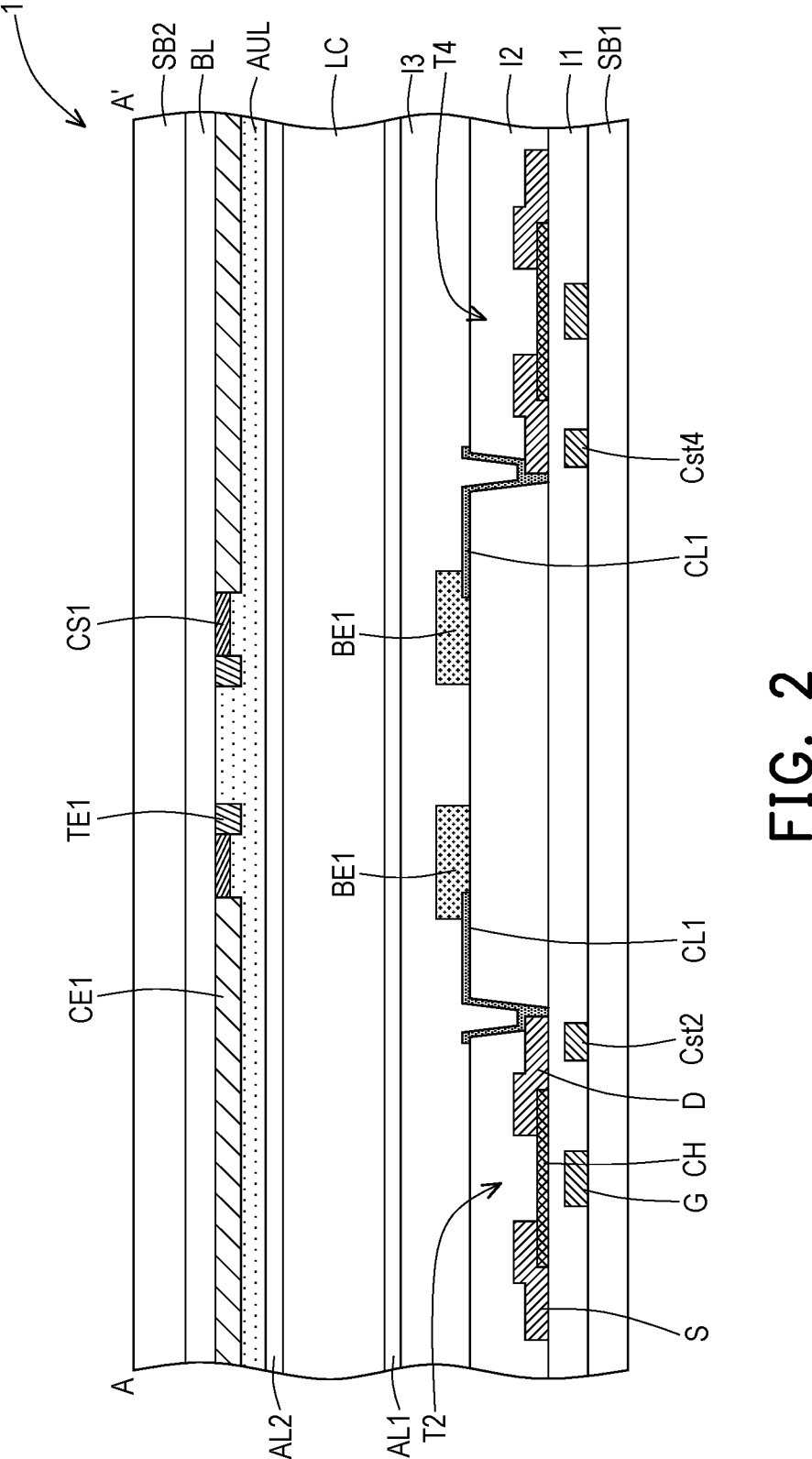
FIG. 2 is a schematic cross-sectional view along the line A-A' of FIGS. 1A and 1B.

FIGS. 1A and 1B are schematic top views of an antenna device 1 according to an embodiment of the present invention. FIG. 2 is a schematic cross-sectional view along the line A-A' of FIGS. 1A and 1B. For the sake of clarity, FIGS. 1A and 1B only illustrate the conductive structures of the antenna device 1, and the dielectric layers between conductive structures are omitted. In addition, FIG. 1A illustrates the components formed on the first substrate SB1, and omits the components formed on the second substrate SB2.

Referring to FIGS. 1A to 2, the antenna device 1 includes a first substrate SB1 and a second substrate SB2. A plurality of antenna units are disposed between the first substrate SB1 and the second substrate SB2. In FIGS. 1A and 1B, four adjacent antenna units (i.e., the first antenna unit U1 to the fourth antenna unit U4) are taken as an example for explanation.

The first substrate SB1 and the second substrate SB2 each include glass, quartz, organic polymer or other applicable materials. The first antenna unit U1 to the fourth antenna unit U4 are disposed above the first substrate SB and are located between the first substrate SB1 and the second substrate SB2. In this embodiment, each of the first antenna unit U1 to the fourth antenna unit U4 includes a similar structure.

In this embodiment, the first antenna unit U1 includes a first transistor T1 to a fourth transistor T4, a first capacitor electrode Cst1 to a fourth capacitor electrode Cst4, a first signal line CL1, a first lower antenna electrode BE1, a first upper antenna electrode TE1, a first common electrode CE1 and a first connection structure CS1.

In this embodiment, the second antenna unit U2 includes a fifth transistor T5 to an eighth transistor T8, a fifth capacitor electrode Cst5 to an eighth capacitor electrode Cst8, a second signal line CL2, a second lower antenna electrode BE2, a second upper antenna electrode TE2, a second common electrode CE2 and a second connection structure CS2.

In this embodiment, the third antenna unit U3 includes a ninth transistor T9 to a twelfth transistor T12, a ninth capacitor electrode Cst9 to a twelfth capacitor electrode Cst12, a third signal line CL3, a third lower antenna electrode BE3, a third upper antenna electrode TE3, the third common electrode CE3 and the third connection structure CS3.

In this embodiment, the fourth antenna unit U4 includes a thirteenth transistor T13 to a sixteenth transistor T16, a thirteenth capacitor electrode Cst13 to a sixteenth capacitor electrode Cst16, a fourth signal line CL4, a fourth lower antenna electrode BE4, a fourth upper antenna electrode TE4, the fourth common electrode CE4 and the fourth connection structure CS4.

Each of the first to sixteenth transistors T1 to T16 includes a gate electrode G, a semiconductor layer CH, a source electrode S, and a drain electrode D.

The gate electrodes G, the plurality of scan lines SL, and the first to sixteenth capacitor electrodes Cst1 to Cst16 are formed above the first substrate SB1 and belong to the same conductive layer, such as the first metal layer. In some embodiments, the material of the first metal layer includes chromium, gold, silver, copper, tin, lead, hafnium, tungsten, molybdenum, neodymium, titanium, tantalum, aluminum, zinc, nickel or alloys of the above metals or the stacked layers of the above metals. In some embodiments, the first metal layer includes a stack of titanium, aluminum, and titanium.

The gate electrodes G are electrically connected to the corresponding scan lines SL. In this embodiment, the gate electrodes G of the first, second, fifth and sixth transistors T1, T2, T5 and T6 are electrically connected to the same scan line SL; the gate electrodes G of the third, fourth, seventh and eighth transistors T3, T4, T7 and T8 are electrically connected to another same scan line SL; the gate electrodes G of the ninth, tenth, thirteenth and fourteenth transistors T9, T10, T13 and T14 are electrically connected to still another same scan line SL; the gate electrodes G of the eleventh, twelfth, fifteenth and sixteenth transistors T11, T12, T15 and T16 are electrically connected to still still another same scan line SL. The scan lines SL are extending along the first direction D1.

The first capacitor electrode Cst1 to the sixteenth capacitor electrode Cst16 are separated from the scan lines SL. In some embodiments, the capacitor electrodes of adjacent antenna units in the first direction D1 are connected to each other through a common signal line (not shown). In some embodiments, the common signal line and capacitor electrodes are integrated as one and both belong to the first metal layer. In some embodiments, the shape of the capacitor electrode includes a strip, a rectangle, a circle, an oval, a triangle, or other geometric shapes.

The first dielectric layer I1 is formed on the first metal layer. In some embodiments, the material of the first dielectric layer I1 includes silicon oxide, silicon nitride, silicon oxynitride, aluminum oxide, hafnium oxide, zirconium oxide, organic insulating materials or other suitable materials.

The semiconductor layers CH are formed on the first dielectric layer I1 and overlapping with the corresponding gate electrodes G. In some embodiments, the semiconductor layer CH has a single-layer structure or multi-layer structure, which includes amorphous silicon, polycrystalline silicon, microcrystalline silicon, single crystal silicon, organic semiconductor materials, oxide semiconductor materials (for example: indium zinc oxide, indium gallium zinc oxide or other suitable materials or combinations of the above materials) or other suitable materials or combinations of the above materials.

The source electrodes S, the drain electrodes D and a plurality of data lines DL are formed on the first dielectric layer I1 and belong to the same conductive layer, such as the second metal layer. In some embodiments, the material of the second metal layer includes chromium, gold, silver, copper, tin, lead, hafnium, tungsten, molybdenum, neodymium, titanium, tantalum, aluminum, zinc, nickel or alloys of the above metals or the stacked layers of the above metals. In some embodiments, the second metal layer includes a stack of titanium, aluminum, and titanium. The source electrodes S and the drain electrodes D are respectively connected to the corresponding semiconductor layers CH. It should be noted that the source electrode S and the drain electrode D in the transistor can be swapped according to the change in current direction. In this embodiment, the source electrodes S are electrically connected to the corresponding data lines DL. The drain electrodes D of the first to sixteenth transistors T1 to T16 are respectively overlapping with the first to sixteenth capacitor electrodes Cst1 to Cst16. In this embodiment, the first, fourth, thirteenth and sixteenth transistors T1, T4, T13 and T16 are electrically connected to the same data line DL; the second, third, fourteenth and fifteenth transistors T2, T3, T14, T15 are electrically connected to another same data line DL; the fifth, eighth, ninth and twelfth transistors T5, T8, T9, T12 are electrically connected to still another same data line DL; the sixth, seventh, tenth and eleventh transistors T6, T7, T10, T11 are electrically connected to still still another same data line DL. The data lines DL are extending along the second direction D2. The first direction D1 is not parallel to the second direction D2. For example, the first direction D1 is perpendicular to the second direction D2.

The second dielectric layer 12 is formed on the second metal layer. In some embodiments, the material of the second dielectric layer 12 includes silicon oxide, silicon nitride, silicon oxynitride, aluminum oxide, hafnium oxide, zirconium oxide, organic insulating materials or other suitable materials.

The first signal line CL1 to fourth signal line CL4 are formed on the second dielectric layer 12 and are electrically connected to the corresponding transistor through the through holes in the second dielectric layer 12. In this embodiment, the first signal line CL1 is electrically connected to the first transistor T1 to the fourth transistor T4; the second signal line CL2 is electrically connected to the fifth transistor T5 to the eighth transistor T8; the third signal line CL3 is electrically connected to the ninth transistor T9 to the twelfth transistor T12; the fourth signal line CL4 is electrically connected to the thirteenth transistor T13 to the sixteenth transistor T16. In some embodiments, the materials of the first signal line CL1 to the fourth signal line CL4 include metal oxide conductive materials (such as indium tin oxide, indium zinc oxide, fluorine-doped indium oxide), metal nitride conductive materials (such as titanium nitride or molybdenum nitride) or combinations of the above materials or other suitable materials. The electrical impedance of the material of the first signal line CL1 to the fourth signal line CL4 is higher than the electrical impedance of the material of the second metal layer.

The first lower antenna electrode BE1 to the fourth lower antenna electrode BE4 are formed on the second dielectric layer 12. The first lower antenna electrode BE1 is electrically connected to the first transistor T1 to the fourth transistor T4 through the first signal line CL1; the second lower antenna electrode BE2 is electrically connected to the fifth transistor T5 to the eighth transistor T8 through the second signal line CL2; the third lower antenna electrode BE3 is electrically connected to the ninth transistor T9 to the twelfth transistor T12 through the third signal line CL3; the fourth lower antenna electrode BE4 is electrically connected to the thirteenth transistor T13 to the sixteenth transistor T16 through the fourth signal line CL4.

The first lower antenna electrode BE1 to the fourth lower antenna electrode BE4 include a single-layer structure or a multi-layer structure. In some embodiments, the materials of the first lower antenna electrode BE1 to the fourth lower antenna electrode BE4 include aluminum, copper, molybdenum, titanium or other suitable materials or combinations of the above materials.

Each of the first lower antenna electrode BE1 to the fourth lower antenna electrode BE4 includes a plurality of separated island structures. In this embodiment, each island structure is a strip structure. In other embodiments, each island-shaped structure is an L-shaped structure (referring to FIGS. 7A and 7B) or has other geometric shapes.

In some embodiments, the first lower antenna electrode BE1 to the fourth lower antenna electrode BE4 need to have a higher thickness to satisfy the skin depth required by the skin effect, thereby enabling the first lower antenna electrode BE1 to the fourth lower antenna electrode BE4 to send a sufficiently strong wireless signal and achieve a stronger intensity of coupling antenna.

In some embodiments, the thickness of the first lower antenna electrode BE1 to the fourth lower antenna electrode BE4 is greater than the thickness of the first signal line CL1 to the fourth signal line CL4. In some embodiments, the thickness of the first lower antenna electrode BE1 to the fourth lower antenna electrode BE4 is 0.6 micrometers to 3 micrometers.

Connecting the lower antenna electrode and the transistor through a signal line with a higher electrical impedance can reduce the leaky-wave generated by high-frequency signals on the signal line and prevent the antenna radiation intensity from being reduced. In some embodiments, the low-frequency operation signal of the transistor can be used to control the liquid crystal molecules in the liquid crystal layer LC, and the high-frequency signal is the antenna signal. For example, by changing the voltage (or electric field) applied to the liquid crystal layer LC through a low-frequency operation signal, the radiation intensity, radiation phase delay, radiation propagation direction, and radiation beam shape of the antenna unit can be changed. The liquid crystal layer LC, for instance, is a low-loss liquid crystal layer that can work in the high-frequency range.

The third dielectric layer 13 is formed on the first lower antenna electrode BE1 to the fourth lower antenna electrode BE4. In some embodiments, the material of the third dielectric layer 13 includes silicon oxide, silicon nitride, silicon oxynitride, aluminum oxide, hafnium oxide, zirconium oxide, organic insulating materials or other suitable materials. The first alignment layer AL1 is formed above the third dielectric layer 13.

In some embodiments, the buffer layer BL is formed on the second substrate SB2, but the invention is not limited thereto. In other embodiments, the buffer layer BL may be omitted.

The first upper antenna electrode TE1 to the fourth upper antenna electrode TE4, the first common electrode CE1 to the fourth common electrode CE4, and the first connection structure CS1 to the fourth connection structure CS4 are formed on the second substrate SB2 or the buffer layer BL. In some embodiments, the first upper antenna electrode TE1 to the fourth upper antenna electrode TE4 and the first common electrode CE1 to the fourth common electrodes CE4 belong to the same conductive layer, such as a common electrode layer. In some embodiments, the material of the common electrode layer includes chromium, gold, silver, copper, tin, lead, hafnium, tungsten, molybdenum, neodymium, titanium, tantalum, aluminum, zinc, nickel or alloys of the above metals or the stacked layers of the above metals.

The first upper antenna electrode TE1 to the fourth upper antenna electrode TE4 are each in a ring shape. For example, the first upper antenna electrode TE1 to the fourth upper antenna electrode TE4 each include a cross-shaped annular.

In the normal direction of the top surface of the second substrate SB2, the first upper antenna electrode TE1 to the fourth upper antenna electrode TE4 are respectively at least partially overlapping with the first lower antenna electrode BE1 to the fourth lower antenna electrode BE4.

The first common electrode CE1 to the fourth common electrode CE4 surround the first upper antenna electrode TE1 to the fourth upper antenna electrode TE4 respectively. For example, the first common electrode CE1 to the fourth common electrode CE4 each have an opening, and the first upper antenna electrode TE1 to the fourth upper antenna electrode TE4 are respectively located between the opening of the first common electrode CE1 to the opening of the fourth common electrode CE4.

The first upper antenna electrode TE1 to the fourth upper antenna electrode TE4 are electrically connected to the first common electrode CE1 to the fourth common electrode CE4 through the first connection structure CS1 to the fourth connection structure CS4 respectively. In some embodiments, the thickness of the first connection structure CS1 to the fourth connection structure CS4 is less than or equal to the thickness of the first upper antenna electrode TE1 to the fourth upper antenna electrode TE4 and the thickness of the first common electrode CE1 to the fourth common electrode CE4. In some embodiments, the material of the first connection structure CS1 to the fourth connection structure CS4 are the same as or different from the material of the first upper antenna electrode TE1 to the fourth upper antenna electrode TE4 and the material of the first common electrode CE1 to the fourth common electrode CE4.

In this embodiment, the first common electrode CE1 to the fourth common electrode CE4 are integrated as one, but the invention is not limited thereto. In other embodiments, the first common electrode CE1 to the fourth common electrode CE4 are separated from each other and are electrically connected together through other conductive structures.

The protection layer AUL is formed on the second substrate SB2 or the buffer layer BL. The protection layer AUL is used, for example, to convert ultraviolet light with a wavelength lower than or equal to 400 nm into the visible light or the infrared light. In some embodiments, the material of the protection layer AUL includes a fluorescent material, a quantum dot material or other suitable materials. In some embodiments, the protection layer AUL includes a filter material, and has a transmittance of less than 50% for ultraviolet light with a wavelength below 420 nm, and less than 1% for ultraviolet light with a wavelength below 400 nm. In some embodiments, the protection layer AUL is, for example, a red filter element or a green filter element.

In some embodiments, the protection layer AUL may be composed of alternating stacks of multiple high refractive index dielectric layers and multiple low refractive index dielectric layers, and ultraviolet light is reflected by Bragg reflection. In some embodiments, the materials of the dielectric layers in the protection layer AUL include, for example, $SiO_2$ (refractive index=1.5), SiNx (refractive index=1.9), AlN (refractive index=2), $Al_2O_3$ (refractive index=1.6), $TiO_2$ (refractive index=3) or other suitable materials.

In this embodiment, the protection layer AUL is formed entirely on the buffer layer BL, and the protection layer AUL is overlapping with the first upper antenna electrode TE1 to the fourth upper antenna electrode TE4, the first common electrode CE1 to the fourth common electrode CE4, and the first connection structure CS1 to the fourth connection structure CS4 in the normal direction of the top surface of the second substrate SB2. In other embodiments, a patterning process can be performed on the protection layer AUL so that the protection layer AUL does not overlap the first upper antenna electrode TE1 to the fourth upper antenna electrode TE4, the first common electrode CE1 to the fourth common electrode CE4. Alternatively, the protection layer AUL is formed only in the gap within the common electrode layer.

In this embodiment, the first upper antenna electrode TE1 to the fourth upper antenna electrode TE4, the first common electrode CE1 to the fourth common electrode CE4, and the first connection structure CS1 to the fourth connection structure CS4 are located between the protection layer AUL and the second substrate SB2, but the present invention is not limited thereto. In other embodiments, the protection layer AUL is first formed on the second substrate SB2 or the buffer layer BL, and then the first upper antenna electrode TE1 to the fourth upper antenna electrode TE4 and the first common electrode CE1 to the fourth common electrode CE4, and the first connection structure CS1 to the fourth connection structure CS4 are formed on the protection layer AUL. In some embodiments, when the protection layer AUL does not cover the first upper antenna electrode TE1 to the fourth upper antenna electrode TE4, the first common electrode CE1 to the fourth common electrode CE4, and the first connection structure CS1 to the fourth connection structure CS4, optionally forming other protection layers on the first upper antenna electrode TE1 to the fourth upper antenna electrode TE4, the first common electrode CE to the fourth common electrode CE4, and the first connection structure CS1 to the fourth connection structure CS4, so as to sufficiently isolate them from the liquid crystal layer LC.

The second alignment layer AL2 is formed on the protection layer AUL. The liquid crystal layer LC is located between the first alignment layer AL1 and the second alignment layer AL2.

Generally speaking, the shape and position of the metal parts (such as the first metal layer and the second metal layer) in the transistor and its control circuit can cause interference to the signal (such as an electromagnetic wave) fed into the antenna, especially impacting the polarization of the signal. In this embodiment, to reduce the negative impact of the transistor array and its control circuit on the antenna signal, various symmetry characteristics are used to design the transistor and its control circuit in the antenna unit.

In this embodiment, the transistors of each antenna unit (including the first antenna unit U1 to the fourth antenna unit U4) of the antenna device 1 has an internal rotational symmetry axis IRSA of 180 degrees and two internal mirror symmetry axes IMSA1, IMSA2. The following uses the first antenna unit U1 as an example to illustrate the symmetrical relationship of the transistors in each antenna unit.

The gate electrode G, the source electrode S and the drain electrode D of the first transistor T1 and the gate electrode G, the source electrode S and the drain electrode D of the second transistor T2 are respectively symmetrical to the gate electrode G, the source electrode S and the drain electrode D of the fourth transistor T4 and the gate electrode G, the source electrode S and the drain electrode D of the third transistor T3 based on the internal mirror symmetry axis IMSA1. The gate electrode G, the source electrode S and the drain electrode D of the first transistor T1 and the gate electrode G, the source electrode S and the drain electrode D of the fourth transistor T4 are respectively symmetrical to the gate electrode G, the source electrode S and the drain electrode D of the second transistor T2 and the gate electrode G, the source electrode S and the drain electrode D of the third transistor T3 based on the internal mirror symmetry axis IMSA2.

In some embodiments, the first capacitor electrode Cst1 and the second capacitor electrode Cst2 are respectively symmetrical to the fourth capacitor electrode Cst4 and the third capacitor electrode Cst3 based on the internal mirror symmetry axis IMSA1. The first capacitor electrode Cst1 and the fourth capacitor electrode Cst4 are respectively symmetrical to the second capacitor electrode Cst2 and the third capacitor electrode Cst3 based on the internal mirror symmetry axis IMSA2.

The gate electrodes G, the source electrodes S and the drain electrodes D of the first transistor T1 to the fourth transistor T4 are configured to have a rotational symmetry based on the internal rotational symmetry axis IRSA. Specifically, the first transistor T1 to the fourth transistor T4 are configured to have a 180-degree rotational symmetry. The first antenna unit U1 is rotated 180 degrees based on the internal rotational symmetry axis IRSA. The gate electrode G, the source electrode S and the drain electrode D of the first transistor T1 are respectively overlapping with the original positions of the gate electrode G, the source electrode S and the drain electrode D of the third transistor T3, and the gate electrode G, the source electrode S and the drain electrode D of the second transistor T2 are respectively overlapping with the original positions of the gate electrode G, the source electrode S and the drain electrode D of the fourth transistor T4.

Similarly, the first to fourth capacitor electrodes Cst1 to Cst4 are configured to have a 180-degree rotational symmetry based on the internal rotational symmetry axis IRSA.

In some embodiments, the first lower antenna electrode BE1 and the first upper antenna electrode TE1 have a mirror symmetric structure based on the internal mirror symmetry axes IMSA1 and IMSA2. In some embodiments, the first lower antenna electrode BE1 and the first upper antenna electrode TE1 have a rotational symmetry structure of 90 degrees based on the internal rotational symmetry axis IRSA.

In this embodiment, the transistors of adjacent antenna units of the antenna device 1 also have rotational symmetry and mirror symmetry. The following uses the first antenna unit U1 as an example to illustrate the symmetrical relationship between the transistors of adjacent antenna units.

The external mirror symmetry axis OMSA1 is located between the first antenna unit U1 and the fourth antenna unit U4. The gate electrodes G, the source electrodes S and the drain electrodes D of the transistors of the first antenna unit U1 are respectively mirror symmetrical to the gate electrodes G, the source electrodes S and the drain electrodes D of the transistors of the fourth antenna unit U4 based on the external mirror symmetry axis OMSA1. For example, the gate electrode G, the source electrode G, the source electrode S and the drain electrode D of the first transistor T1 are respectively mirror-symmetrical to the gate electrode G, the source electrode S and the drain electrode D of the sixteenth transistor T16 based on the external mirror symmetry axis OMSA1. The gate electrode G, the source electrode S and the drain electrode D of the second transistor T2 are respectively mirror symmetrical to the gate electrode G, the source electrode S and the drain electrode D of the fifteenth transistor T15 based on the external mirror symmetry axis OMSA1.

Similarly, the first capacitor electrode Cst1 to the fourth capacitor electrode Cst4 are mirror symmetrical to the sixteenth capacitor electrodes Cst16, the fifteenth capacitor electrodes Cst15, the fourteenth capacitor electrode Cst14, and the thirteenth capacitor electrode Cst13 based on the external mirror symmetry axis OMSA1, respectively.

The external mirror symmetry axis OMSA2 is located between the first antenna unit U1 and the second antenna unit U2. The gate electrodes G, the source electrodes S and the drain electrodes D of the transistors of the first antenna unit U1 are respectively mirror symmetrical to the gate electrodes G, the source electrodes S and drain electrodes D of the transistors of the second antenna unit U2 based on the external mirror symmetry axis OMSA2. For example, the gate electrode G, the source electrode S and the drain electrode D of the first transistor T1 are respectively mirror symmetrical to the gate electrode G, the source electrode S and the drain electrode D of the sixth transistor T6 based on the external mirror symmetry axis OMSA2. The gate electrode G, the source electrode S and the drain electrode D of the second transistor T2 are respectively mirror symmetrical to the gate electrode G, the source electrode S and the drain electrode D of the fifth transistor T5 based on the external mirror symmetry axis OMSA2.

Similarly, the first capacitor electrode Cst1 to the fourth capacitor electrode Cst4 are mirror symmetrical to the sixth capacitor electrode Cst6, the fifth capacitor electrode Cst5, the eighth capacitor electrode Cst8, and the seventh capacitor electrodeCst7 based on the external mirror symmetry axis OMSA2, respectively.

The first lower antenna electrode BE1 and the first upper antenna electrode TE1 are mirror symmetrical to the fourth lower antenna electrode BE4 and the fourth upper antenna electrode TE4 respectively based on the external mirror symmetry axis OMSA1. The first lower antenna electrode BE1 and the first upper antenna electrode TE1 are mirror symmetrical to the second lower antenna electrode BE2 and the second upper antenna electrode TE2 respectively based on the external mirror symmetry axis OMSA2.

The gate electrodes G, the source electrodes S and the drain electrodes D of the transistors of the first antenna unit U1 are configured to have a rotational symmetry with the gate electrodes G, the source electrodes S and the drain electrodes D of the transistors of the second antenna unit U2 based on the external rotational symmetry axis ORSA1. For example, the gate electrode G, the source electrode S and the drain electrode D of the first transistor T1 are configured to have a 180-degree rotational symmetry with the gate electrode G, the source electrode S and the drain electrode D of the seventh transistor T7, based on the external rotational symmetry axis ORSA1. The first antenna unit U1 and the second antenna unit U2 are rotated 180 degrees based on the external rotational symmetry axis ORSA1. The gate electrode G, the source electrode S and the drain electrode D of the first transistor T1 are respectively overlapping with the original positions of the gate electrode G, the source electrode S and the drain electrode D of the seventh transistor T7, and the gate electrode G, the source electrode S and the drain electrode D of the second transistor T2 are respectively overlapping with the original positions of the gate electrode G, the source electrode S and the drain electrode D of the eighth transistor T8.

Similarly, the first capacitor electrode Cst1 to the fourth capacitor electrode Cst4 are configured to have a 180-degree rotational symmetry with the seventh capacitor electrode Cst7, the eighth capacitor electrode Cst8, the fifth capacitor electrode Cst5, and the sixth capacitor electrode Cst6 based on the external rotational symmetry axis ORSA1, respectively.

The gate electrodes G, the source electrodes S and the drain electrodes D of the transistors of the first antenna unit U1 are configured to have a rotational symmetry with the gate electrodes G, the source electrodes S and the drain electrodes D of the transistors of the third antenna unit U3 based on the external rotational symmetry axis ORSA2. For example, the gate electrode G, the source electrode S and the drain electrode D of the first transistor T1 are configured to have a 180-degree rotational symmetry with the gate electrode G, the source electrode S and the drain electrode D of the eleventh transistor T11 based on the external rotational symmetry axis ORSA2. The first antenna unit U1 and the third antenna unit U3 are rotated 180 degrees based on the external rotational symmetry axis ORSA2. The gate electrode G, the source electrode S and the drain electrode D of the first transistor T1 are respectively overlapping with the original positions of the gate electrode G, the source electrode S and the drain electrode D of the eleventh transistor T11, and the gate electrode G, the source electrode S and the drain electrode D of the second transistor T2 are respectively overlapping with the original positions of the gate electrode G, the source electrode S and the drain electrode D of the twelfth transistor T12.

Similarly, the first capacitor electrode Cst1 to the fourth capacitor electrode Cst4 are configured to have a 180-degree rotational symmetry with the eleventh capacitor electrode Cst11, the twelfth capacitor electrode Cst12, the ninth capacitor electrode Cst9, and the tenth capacitor electrode Cst10 based on the external rotational symmetry axis ORSA2, respectively.

In some embodiments, the internal mirror symmetry axis IMSA1 and the external mirror symmetry axis OMSA1 are parallel to the first direction D1, and the internal mirror symmetry axis IMSA2 and the external mirror symmetry axis OMSA2 are parallel to the second direction D2.

Based on the above, by making the transistor array and its control circuit in the antenna unit symmetrically arranged, it is possible to avoid the electromagnetic wave signal penetrating through the antenna unit from having different impacts on the electromagnetic wave signal with different polarization directions caused by an asymmetric transistor array and its control circuit.

Additionally, it should be noted that in this embodiment, each antenna unit has four transistors, and each transistor is electrically connected to the corresponding lower antenna electrode. However, the invention is not limited thereto. In other embodiments, one or more transistors in the antenna unit may be dummy transistors. These dummy transistors are used solely to improve the symmetry of the structure and do not actually provide signal transmission. For instance, the first transistor T1 in the first antenna unit U1 can be used to provide signals to the first lower antenna electrode BE1, while the second to fourth transistors T2-T4 can be either transistors providing signals to the first lower antenna electrode BE1 or dummy transistors.

Figure 3:
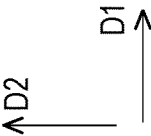
FIG. 3 is a schematic top view of an antenna device according to an embodiment of the present invention.

FIG. 3 is a schematic top view of an antenna device 2 according to an embodiment of the present invention. It should be noted herein that, in embodiments provided in FIG. 3, element numerals and partial content of the embodiments provided in FIG. 1A to FIG. 2 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 3, in the antenna device 2, each antenna unit (including the first antenna unit U1 to the fourth antenna unit U4) has two transistors and two capacitor electrodes. The first transistor T1 to the eighth transistor T8 and the first capacitor electrode Cst1 to the eighth capacitor electrode Cst8 are distributed in the first antenna unit U1 to the fourth antenna unit U4.

In this embodiment, the transistors of each antenna unit (including the first antenna unit U1 to the fourth antenna unit U4) of the antenna device 3 has a 180-degree internal rotational symmetry axis IRSA. The following uses the first antenna unit U1 as an example to illustrate the symmetrical relationship of the transistors in each antenna unit.

The gate electrode G, the source electrode S and the drain electrode D of the first transistor T1 are configured to have a rotational symmetry with the gate electrode G, the source electrode S and the drain electrode D of the second transistor T2 based on the internal rotational symmetry axis IRSA. Specifically, the gate electrode G, the source electrode S, and the drain electrode D of the first transistor T1 are configured to have a 180-degree rotational symmetry with the gate electrode G, the source electrode S, and the drain electrode D of the second transistor T2.

Similarly, the first capacitor electrode Cst1 is configured to have a 180-degree rotational symmetry with the second capacitor electrode Cst2 based on the internal rotational symmetry axis IRSA.

The gate electrodes G, the source electrodes S and the drain electrodes D of the first transistor T1 and the second transistor T2 of the first antenna unit U1 are configured to have a 180-degree rotational symmetry with the gate electrodes G, the source electrodes S and the drain electrodes D of the fourth transistor T4 and the third transistor T3 of the second antenna unit U2 based on the external rotational symmetry axis ORSA1, respectively. Similarly, the first capacitor electrode Cst1 and the second capacitor electrode Cst2 of the first antenna unit U1 are configured to have a 180-degree rotational symmetry with the fourth capacitor electrode Cst4 and the third capacitor electrode Cst3 of the second antenna unit U2 based on the external rotational symmetry axis ORSA1, respectively.

The gate electrodes G, the source electrodes S and the drain electrodes D of the first transistor T1 and the second transistor T2 of the first antenna unit U1 are configured to have a 180-degree rotational symmetry with the gate electrodes G, the source electrodes S, and the drain electrodes D of the sixth transistor T6 and the fifth transistor T5 of the third antenna unit U3 based on the external rotational symmetry axis ORSA2, respectively. Similarly, the first capacitor electrode Cst1 and the second capacitor electrode Cst2 of the first antenna unit U1 are configured to have a 180-degree rotational symmetry with the sixth capacitor electrode Cst6 and the fifth capacitor electrode Cst5 of the third antenna unit U3 based on the external rotational symmetry axis ORSA2, respectively.

Figure 4:
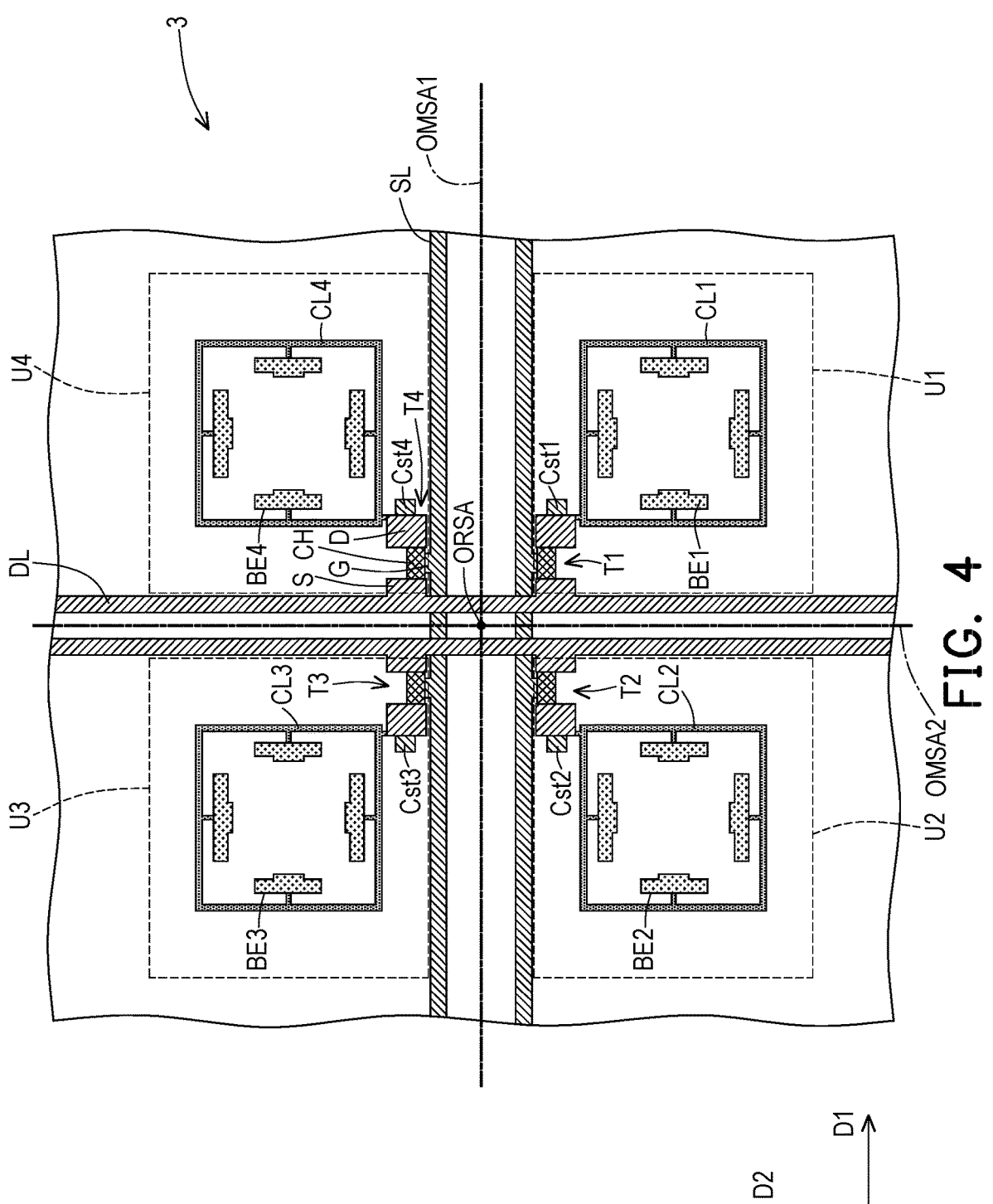
FIG. 4 is a schematic top view of an antenna device according to an embodiment of the present invention.

FIG. 4 is a schematic top view of an antenna device 3 according to an embodiment of the present invention. It should be noted herein that, in embodiments provided in FIG. 4, element numerals and partial content of the embodiments provided in FIG. 1A to FIG. 2 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 4, in the antenna device 3, each antenna unit (including the first antenna unit U1 to the fourth antenna unit U4) has one transistor and one capacitor electrode. The first transistor T1 to the fourth transistor T4 are respectively disposed in the first antenna unit U1 to the fourth antenna unit U4, and the first capacitor electrode Cst1 to the fourth capacitor electrode Cst4 are respectively disposed in the first antenna unit U1 to the fourth antenna unit U4.

The gate electrode G, the source electrode S and the drain electrode D of the first transistor T1 of the first antenna unit U1 are respectively mirror symmetrical to the gate electrode G, the source electrode S and the drain electrode D of the fourth transistor T4 of the fourth antenna unit U4 based on the external mirror symmetry axis OMSA1. Similarly, the first capacitor electrode Cst1 is mirror symmetrical to the fourth capacitor electrode Cst4 based on the external mirror symmetry axis OMSA1.

The gate electrode G, the source electrode S and the drain electrode D of the first transistor T1 of the first antenna unit U1 are respectively mirror symmetrical to the gate electrode G and source electrode S and the drain electrode D of the second transistor T2 of the second antenna unit U2 based on the external mirror symmetry axis OMSA2. Similarly, the first capacitor electrode Cst1 is mirror symmetrical to the second capacitor electrode Cst2 based on the external mirror symmetry axis OMSA2.

In this embodiment, the gate electrode G, the source electrode S and the drain electrode D of the first transistor T1 of the first antenna unit U1 are configured to have a 180-degree rotational symmetry with the gate electrode G, the source electrode S and the drain electrode D of the third transistor T3 of the third antenna unit U3 based on the external rotational symmetry axis ORSA. Similarly, the first capacitor electrode Cst1 of the first antenna unit U1 is configured to have a 180-degree rotational symmetry with the third capacitor electrode Cst3 of the third antenna unit U3 based on the external rotational symmetry axis ORSA.

Figure 5:
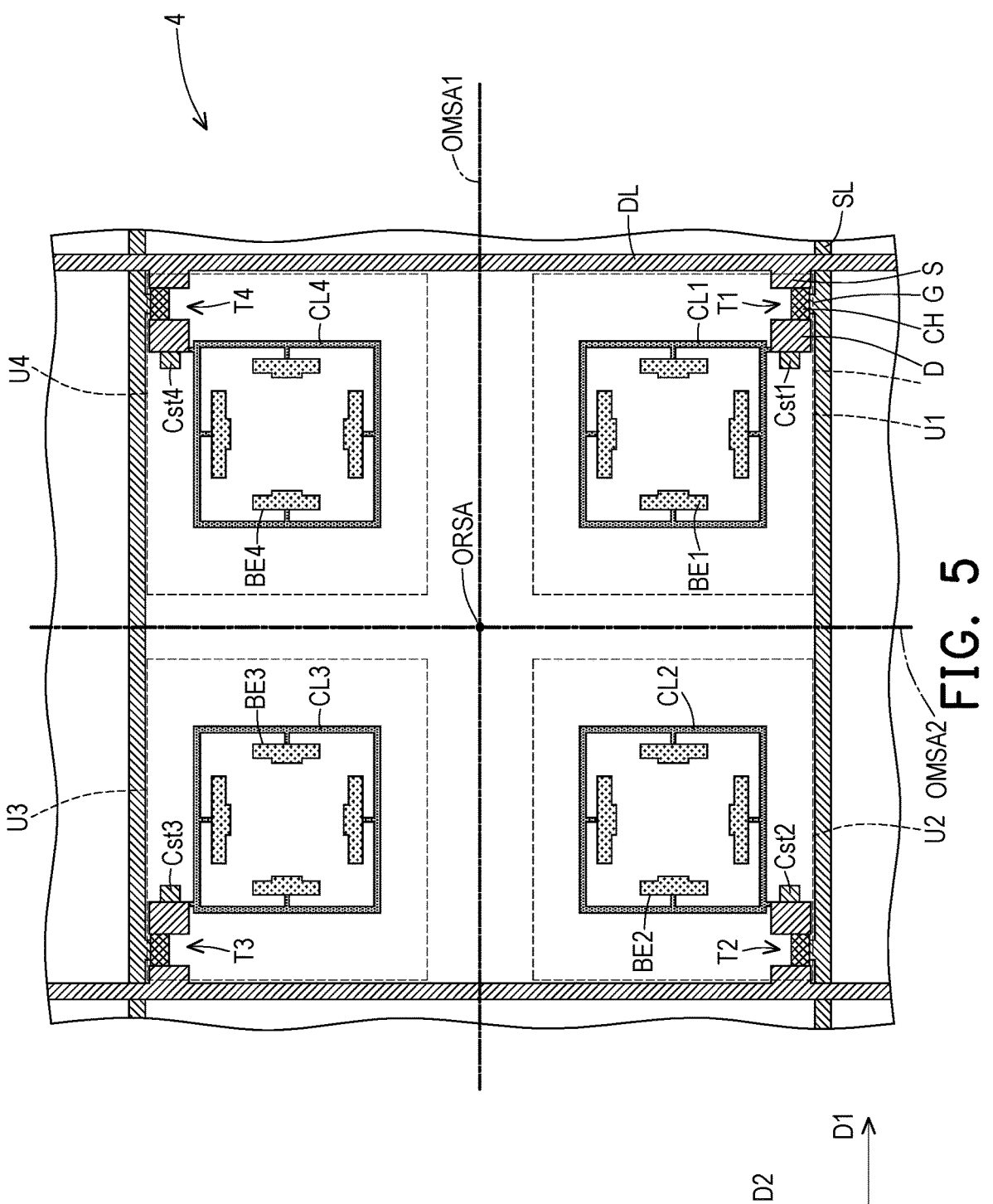
FIG. 5 is a schematic top view of an antenna device according to an embodiment of the present invention.

FIG. 5 is a schematic top view of an antenna device 4 according to an embodiment of the present invention. It should be noted herein that, in embodiments provided in FIG. 5, element numerals and partial content of the embodiments provided in FIG. 4 are followed, the same or similar reference numerals being used to represent the same or similar elements, and description of the same technical content being omitted. For a description of an omitted part, reference may be made to the foregoing embodiment, and the descriptions thereof are omitted herein.

The antenna device 4 in FIG. 5 is similar to the antenna device 3 in FIG. 4. The difference between them is that: in the antenna device 3, the data lines DL and the scan lines SL are concentrated at the boundary between the first to fourth antenna units U1-U4. However, in the antenna device 4, the data lines DL and the scan lines SL are disposed at the periphery of the first antenna unit U1 to the fourth antenna unit U4.

Figure 6:
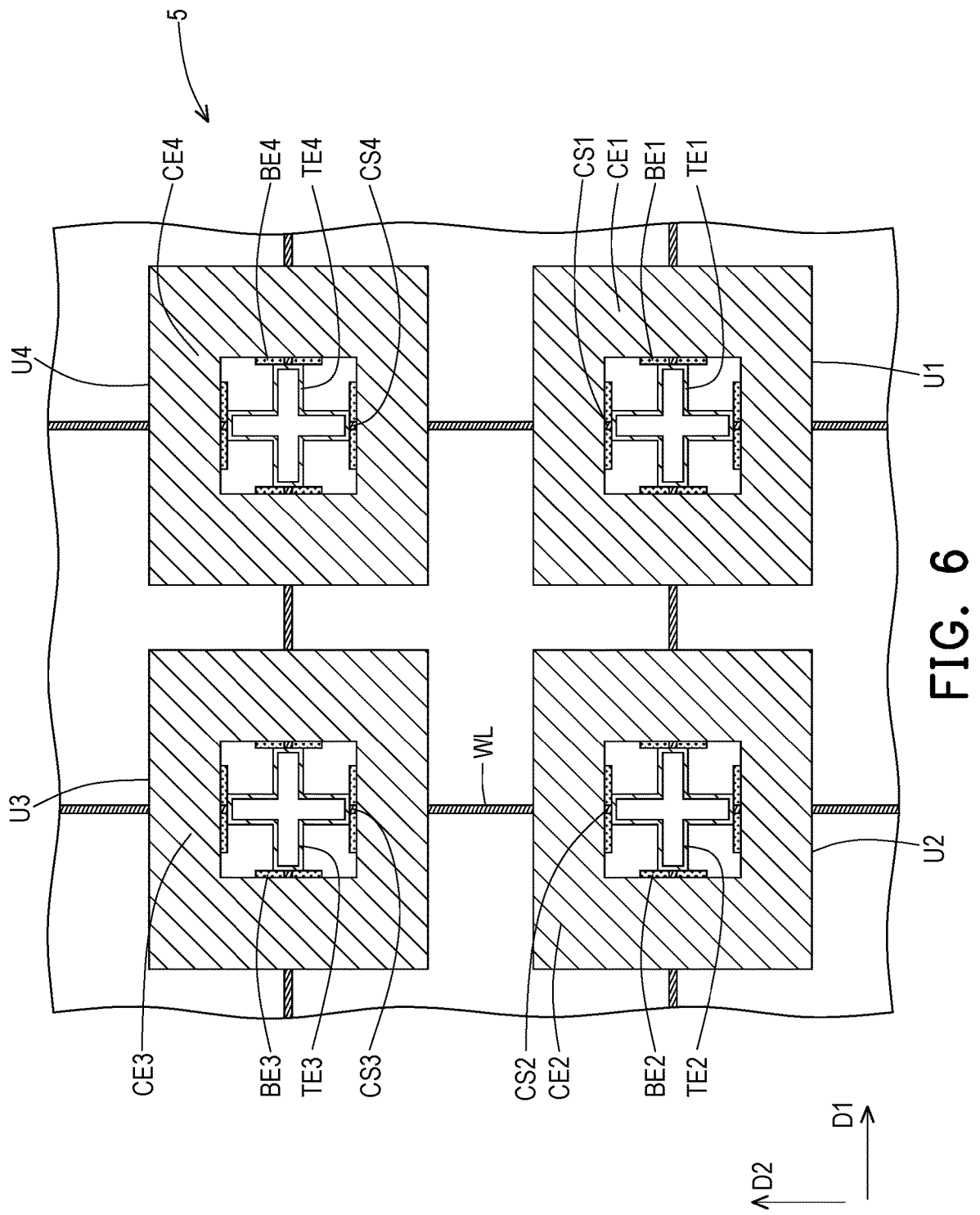
FIG. 6 is a schematic top view of an antenna device according to an embodiment of the present invention.

FIG. 6 is a schematic top view of an antenna device 5 according to an embodiment of the present invention. It should be noted herein that, in embodiments provided in FIG. 6, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein. For the sake of clarity, FIG. 6 only illustrates the first lower antenna electrode BE1 to the fourth lower antenna electrode BE4, the first upper antenna electrode TE1 to the fourth upper antenna electrode TE4, the first connection structure CS1 to the fourth connection structure CS4, the first common electrode CE1 to the fourth common electrode CE4, and a plurality of conductive line structures WL, while other structures are omitted.

Referring to FIG. 6, in this embodiment, the first common electrode CE1 to the fourth common electrode CE4 are electrically connected to each other through the conductive line structures WL. In some embodiments, the conductive line structures WL and the first connection structures CS1 to the fourth connection structure CS4 belong to the same conductive layer, and have the same thickness and the same material.

Figure 7A:
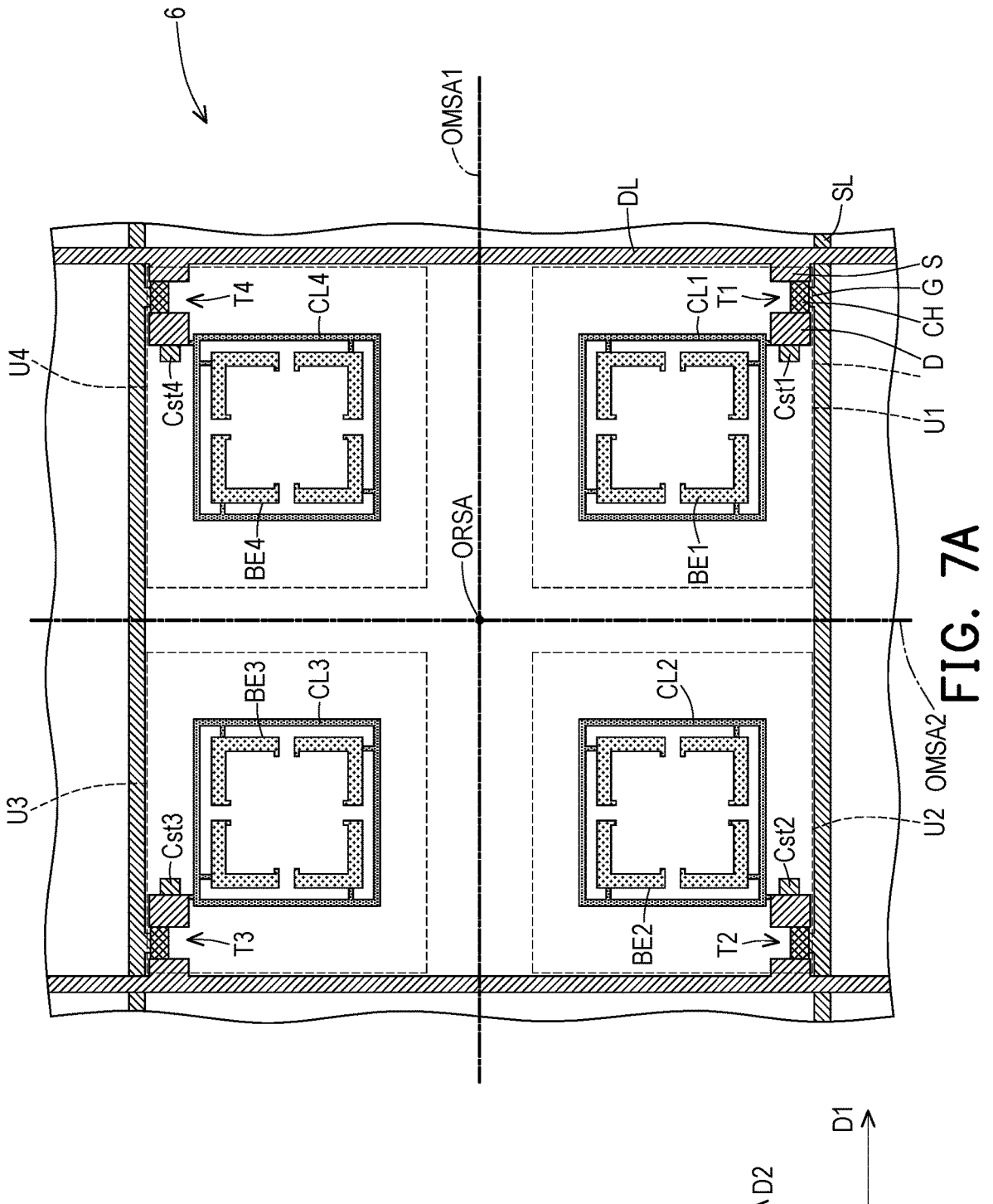
FIGS. 7A and 7B are schematic top views of an antenna device according to an embodiment of the present invention.
Figure 7B:
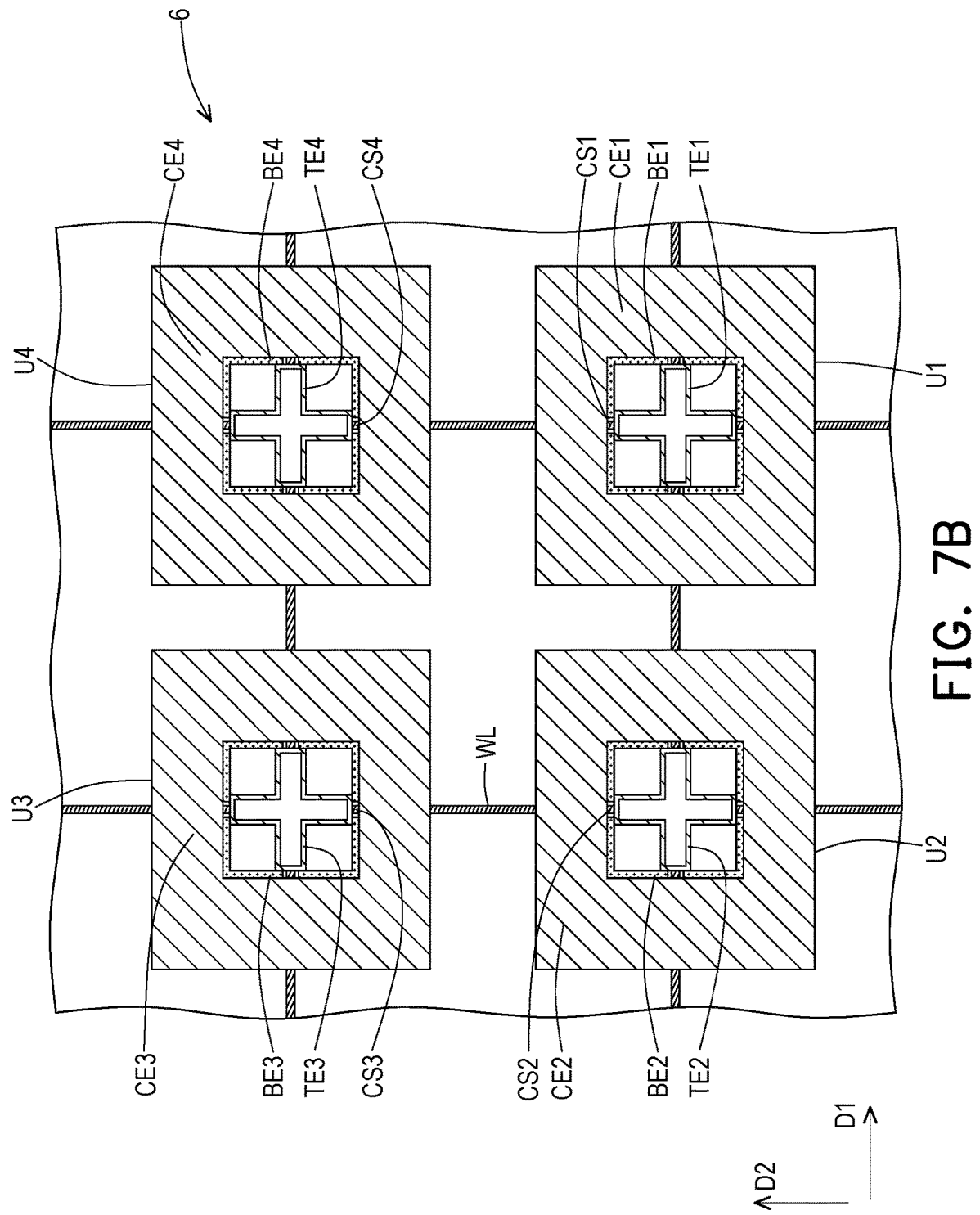

FIGS. 7A and 7B are schematic top views of an antenna device 6 according to an embodiment of the present invention. For the sake of clarity, FIGS. 7A and 7B only illustrate the conductive structures of antenna device 6, and the dielectric layers between the conductive structures are omitted. In addition, FIG. 7A illustrates the components formed on the first substrate, and omits the components formed on the second substrate. It should be noted herein that, in embodiments provided in FIGS. 7A and 7B, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIGS. 7A and 7B, in this embodiment, the first lower antenna electrode BE1 to the fourth lower antenna electrode BE4 each include a plurality of L-shaped structures that are separated from each other.

Figure 8:
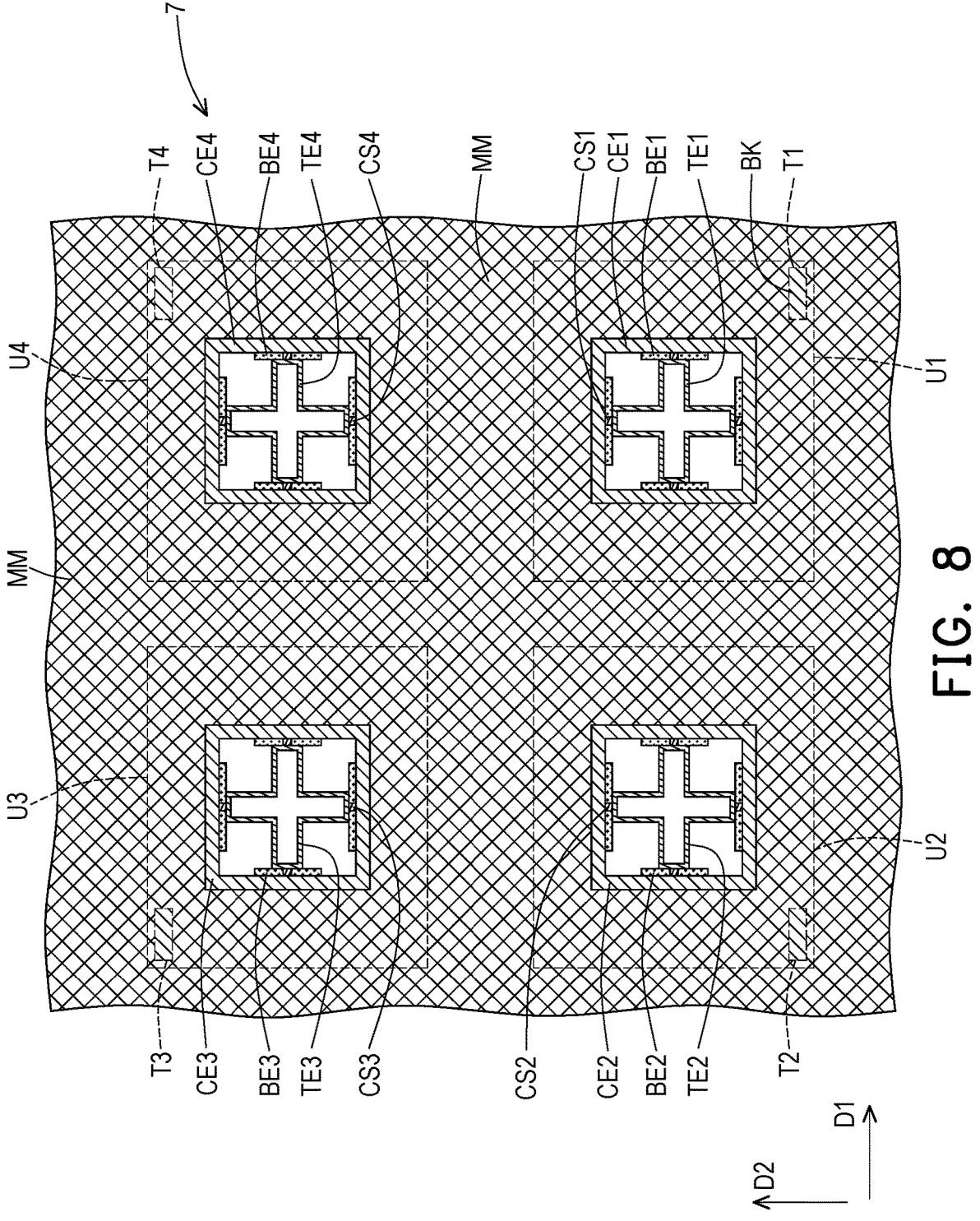
FIG. 8 is a schematic top view of an antenna device according to an embodiment of the present invention.

FIG. 8 is a schematic top view of an antenna device 7 according to an embodiment of the present invention. It should be noted herein that, in embodiments provided in FIG. 8, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 8, in this embodiment, the first common electrode CE1 to the fourth common electrode CE4 are electrically connected to each other through the metal mesh structure MM. The metal mesh structure MM is electrically connected to the first upper antenna electrode TE1 to the fourth upper antenna electrode TE4. The metal mesh structure MM is formed, for example, on the second substrate (referring to the second substrate SB2 in FIG. 2).

In this embodiment, the antenna device 7 also includes a plurality of barrier layers BK. The barrier layers BK are overlapping with the first transistor T1 to the fourth transistor T4 in the normal direction of the top surface of the first substrate (referring to the first substrate SB1 in FIG. 2). In some embodiments, the barrier layer BK, the first common electrode CE1 to the fourth common electrode CE4 and the first upper antenna electrode TE1 to the fourth upper antenna electrode TE4 belong to the same layer.

In this embodiment, the visible light transmittance of the antenna device 7 can be improved through the arrangement of the metal mesh structure MM. At the same time, the barrier layers BK are used to shield the first transistor T1 to the fourth transistor T4 to avoid the generation of photo leakage current. In some embodiments, an additional circular polarizer can be provided outside the antenna device 7 (for example, outside the second substrate SB2 in FIG. 2), thereby reducing the influence of ambient reflected light.

Figure 9:
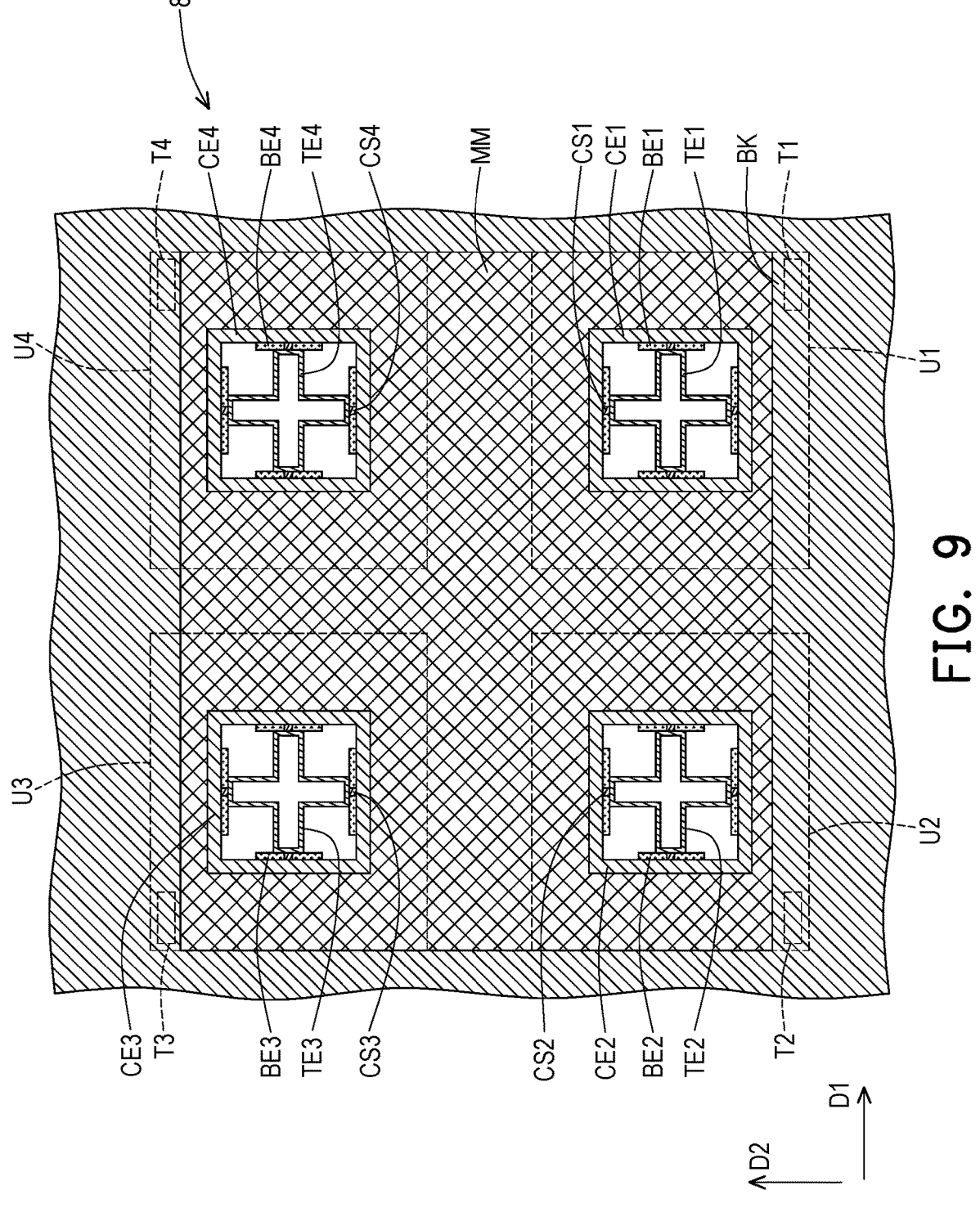
FIG. 9 is a schematic top view of an antenna device according to an embodiment of the present invention.

FIG. 9 is a schematic top view of an antenna device 8 according to an embodiment of the present invention 8. It should be noted herein that, in embodiments provided in FIG. 9, element numerals and partial content of the embodiments provided in FIG. 8 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 9, in this embodiment, the barrier layer BK used to shield the first transistor T1 to the fourth transistor T4 is integrated as one, thereby reducing the electrical resistance.

In some embodiments, the barrier layer BK is electrically connected to a signal source, and the signal source is used to provide a common voltage signal for the first upper antenna electrode TE1 to the fourth upper antenna electrode TE4. In addition, in some embodiments, in order to distribute the common voltage signal provided to the antenna device 8 more evenly, a plurality of signal sources may be provided and connected to different areas of the barrier layer BK. In some embodiments, the different areas mentioned above can be electrically independent of each other and can be operated separately using different signal sources.

Figure 10:
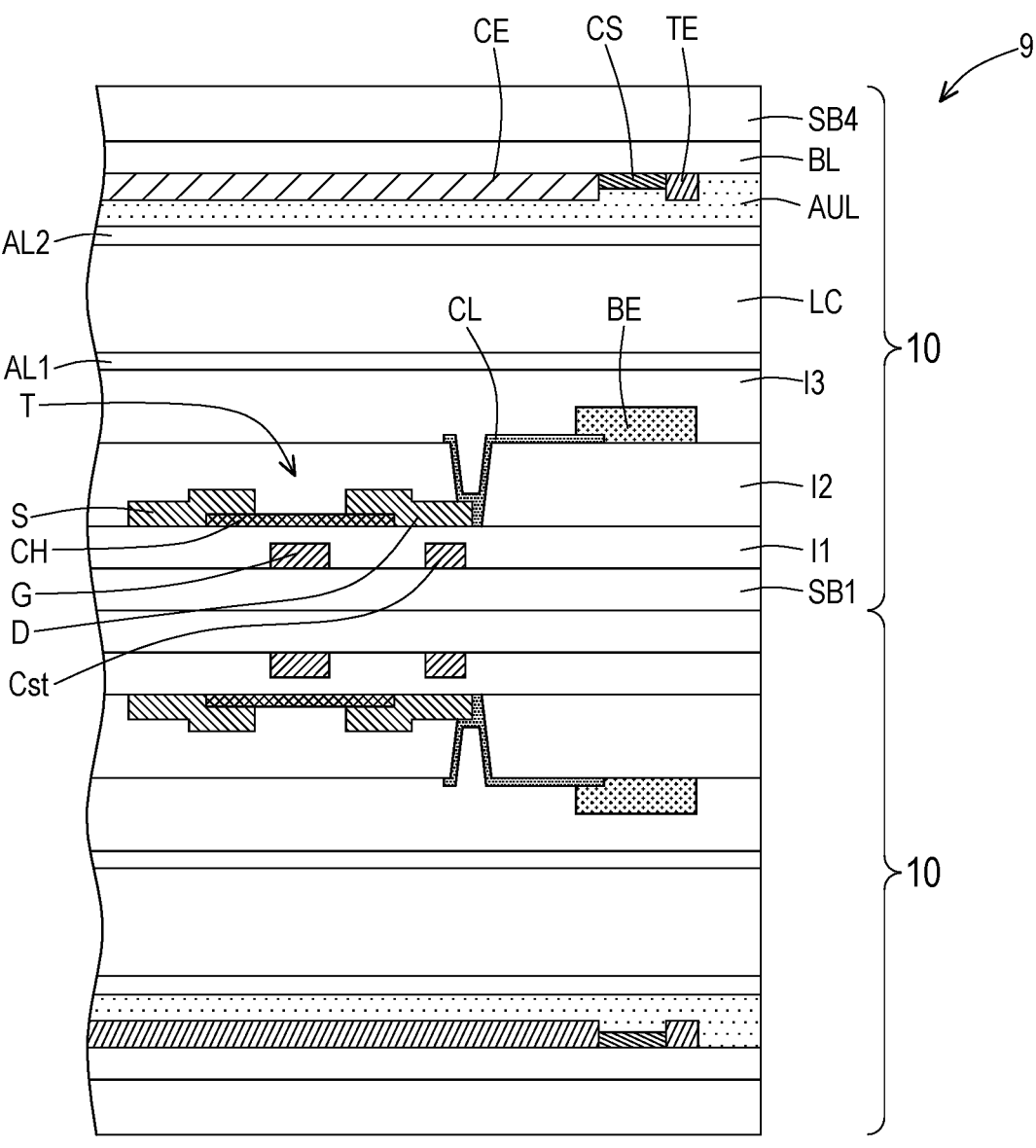
FIG. 10 is a schematic cross-sectional view of an antenna device according to an embodiment of the present invention.

FIG. 10 is a schematic cross-sectional view of an antenna device 9 according to an embodiment of the present invention. It should be noted herein that, in embodiments provided in FIG. 10, element numerals and partial content of the embodiments provided in FIG. 2 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 10, in this embodiment, the antenna device 9 includes two antenna modules 10 stacked together. Each antenna module 10 includes a first substrate SB1, a second substrate SB2, and a plurality of antenna units U located between the first substrate SB1 and the second substrate SB2. Each antenna unit U itself may include one or more transistors T and one or more capacitor electrodes Cst, as shown in the first antenna unit U1 to the fourth antenna unit U4 in any embodiment of FIG. 1A to FIG. 9. The symmetrical relationship between the transistors T and the capacitor electrodes Cst in one antenna unit U and the symmetrical relationship between the transistors T and the capacitor electrodes Cst in the adjacent antenna unit U can be referred to the embodiments in FIG. 1A to FIG. 9, and the descriptions thereof are omitted herein.

The transistor T is electrically connected to the lower antenna electrode BE through the signal line CL. The lower antenna electrode BE is at least partially overlapping with the upper antenna electrode TE. The common electrode CE surrounds the upper antenna electrode TE and is electrically connected to the upper antenna electrode TE through the connection structure CS.

Two antenna modules 10 are stacked together in a back-to-back manner. In FIG. 10, the gate electrode G, the source electrode S and the drain electrode D of the transistor T of the antenna module 10 located above are respectively over-lapping with the gate electrode G, the source electrode S and the drain electrode D of the transistor T of the antenna module 10 located below. The lower antenna electrode BE and the upper antenna electrode TE of the antenna module 10 located above are respectively overlapping with the lower antenna electrode BE and upper antenna electrode TE of the antenna module 10 located below.

Figures 11, 12, 13, 14:
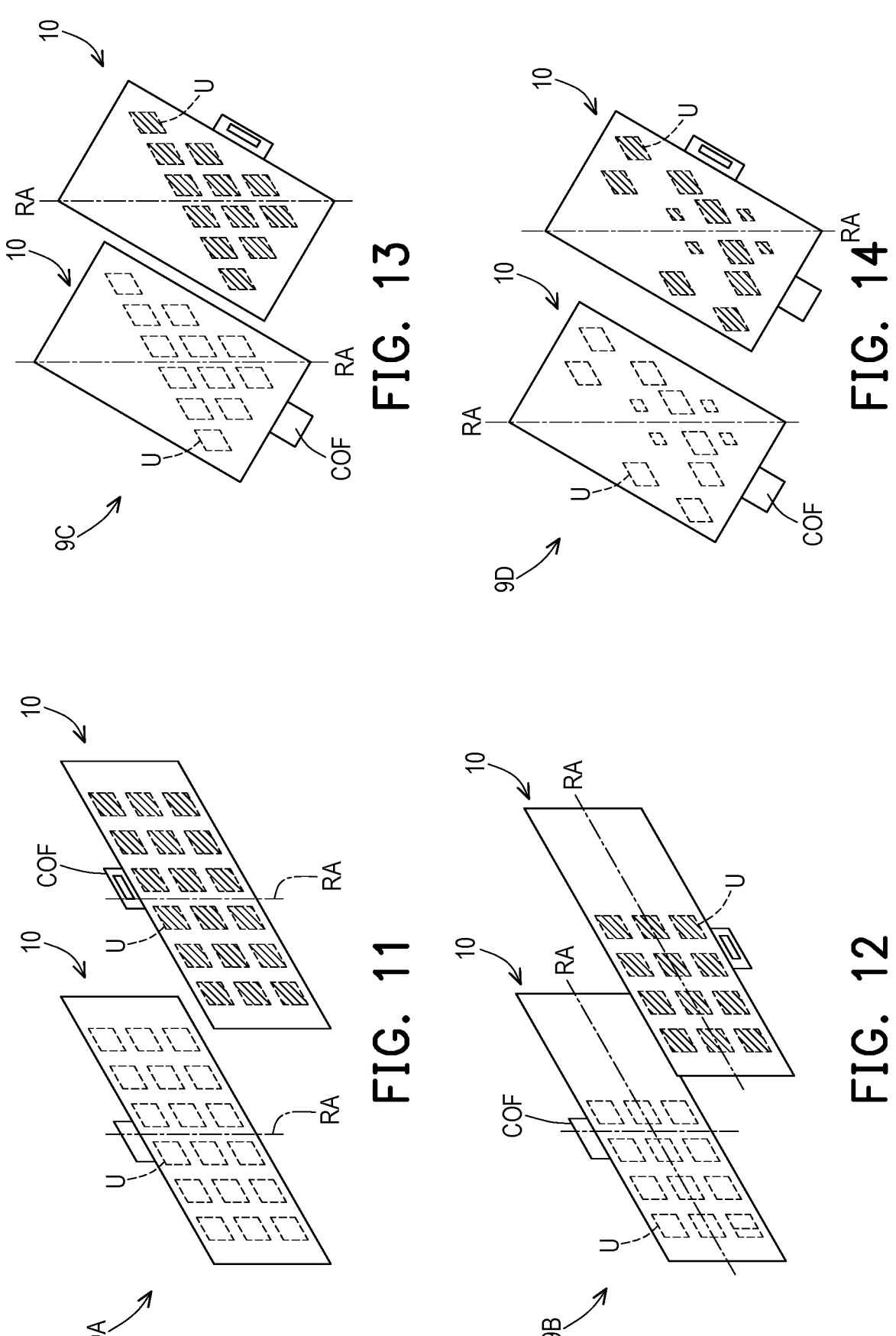
FIGS. 11 to 14 are exploded schematic diagrams of an antenna device with stacked antenna modules according to some embodiments of the present invention.

FIG. 11 is an exploded view of an antenna device 9A according to an embodiment of the present invention. A cross-sectional view of two antenna modules 10 combined in the antenna device 9A is shown in FIG. 10. Referring to FIG. 11, combining two identical antenna modules 10 together, the left antenna module 10 is the same as the right antenna module 10 when rotated 180 degrees along the rotation axis RA, and vice versa. In the embodiment of FIG. 11, the antenna units U in the antenna modules 10 have a mirror-symmetric design, as shown in the embodiments of FIG. 1A, FIG. 4 to FIG. 9. Therefore, when the antenna module 10 is rotated 180 degrees along the rotation axis RA and overlapped with another antenna module 10, the antenna units U of the two antenna modules 10 can correspond to each other and overlap with each other. Specifically, the gate electrodes G, the source electrodes S, the drain electrodes D, and the capacitor electrodes Cst of the transistors T in the antenna units U of one antenna module 10 are respectively overlapping with the gate electrodes G, the source electrodes S, the drain electrodes D, and the capacitor electrodes Cst of the transistors T in the antenna units U of another antenna module 10. This design can reduce the attenuation of the antenna signal.

In some embodiments, each antenna module 10 is pro-vided with at least one chip-on-film packaging structure COF. In other embodiments, a chip-on-glass (COG) pack-aging structure and/or a flexible printed circuit (FPC) is connected to the antenna module 10.

In addition, according to the design of the symmetric structure of the antenna units U in the antenna module 10 (such as the direction of the symmetry axis) and the arrange-ment of the antenna units U, one antenna module 10 may be rotated 180 degrees along different rotation axes RA and overlapped with another antenna module 10, as shown in the antenna device 9B in FIG. 12, the antenna device 9C in FIG. 13, and the antenna device 9D in FIG. 14. In addition, in some embodiments, one antenna module 10 may include antenna units U of different sizes, and two overlapping antenna units U have the same size, as shown in FIG. 14.

In addition, in other embodiments, two or more antenna modules 10 can be stacked together, thereby improving the overall phase modulation value of the antenna device.

Figure 15:
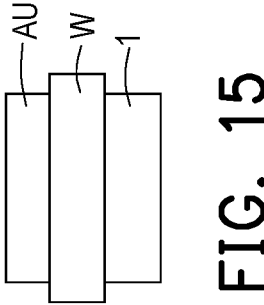

FIG. 15 to FIG. 18 are schematic cross-sectional views of antenna devices according to some embodiments of the present invention. The structure disclosed in FIG. 15 to FIG. 18 can be used as a window, for example. Referring to FIG. 15, the antenna device 1 is integrated with a glass W and an anti-UV film AUF. In the embodiment of FIG. 15, the antenna device 1 and the anti-UV film AUF are disposed on both sides of the glass W, respectively. In some embodi-ments, the anti-UV film AUF has a transmittance of less than 50% to ultraviolet light with a wavelength below 420 nm, and a transmittance of less than 1% to ultraviolet light with a wavelength below 400 nm.

Figure 16:
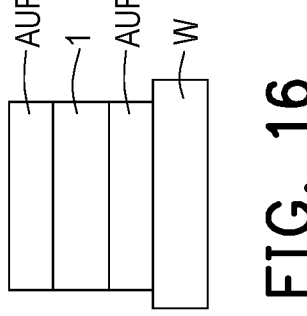

Referring to FIG. 16, two anti-UV films AUF are attached to both sides of the antenna device 1, and the antenna device 1 and the two anti-UV films AUF are disposed on the glass W together.

In FIG. 15 and FIG. 16, the structure of the antenna device 1 may refer to FIG. 1A to FIG. 2. In other embodiments, other types of the antenna devices disclosed in FIG. 3 to FIG. 9 may also be integrated with the anti-UV film AUF and the glass W using the methods disclosed in FIG. 15 and FIG. 16.

Figure 17:
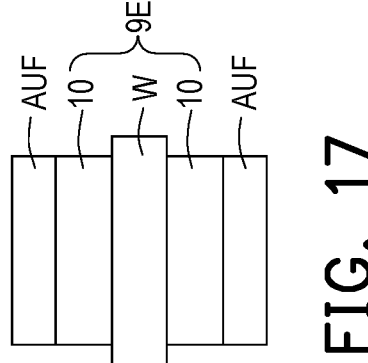

Referring to FIG. 17, in this embodiment, the antenna device 9E includes two antenna modules 10 overlapped together. The stacking method of the antenna modules 10 in the antenna device 9E is similar to the stacking method of the antenna modules 10 in the antenna device 9 of FIG. 10. For related descriptions, please refer to the embodiment of FIG. 10 and will not be repeated here. In this embodiment, the glass W is disposed between the two antenna modules 10. The two anti-UV films AUF are attached to the outsides of the two antenna modules 10, respectively.

Figure 18:
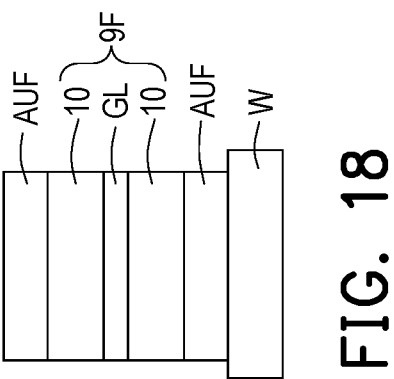
FIGS. 15 to 18 are schematic cross-sectional views of an antenna device according to some embodiments of the present invention.
Figures 19, 20:
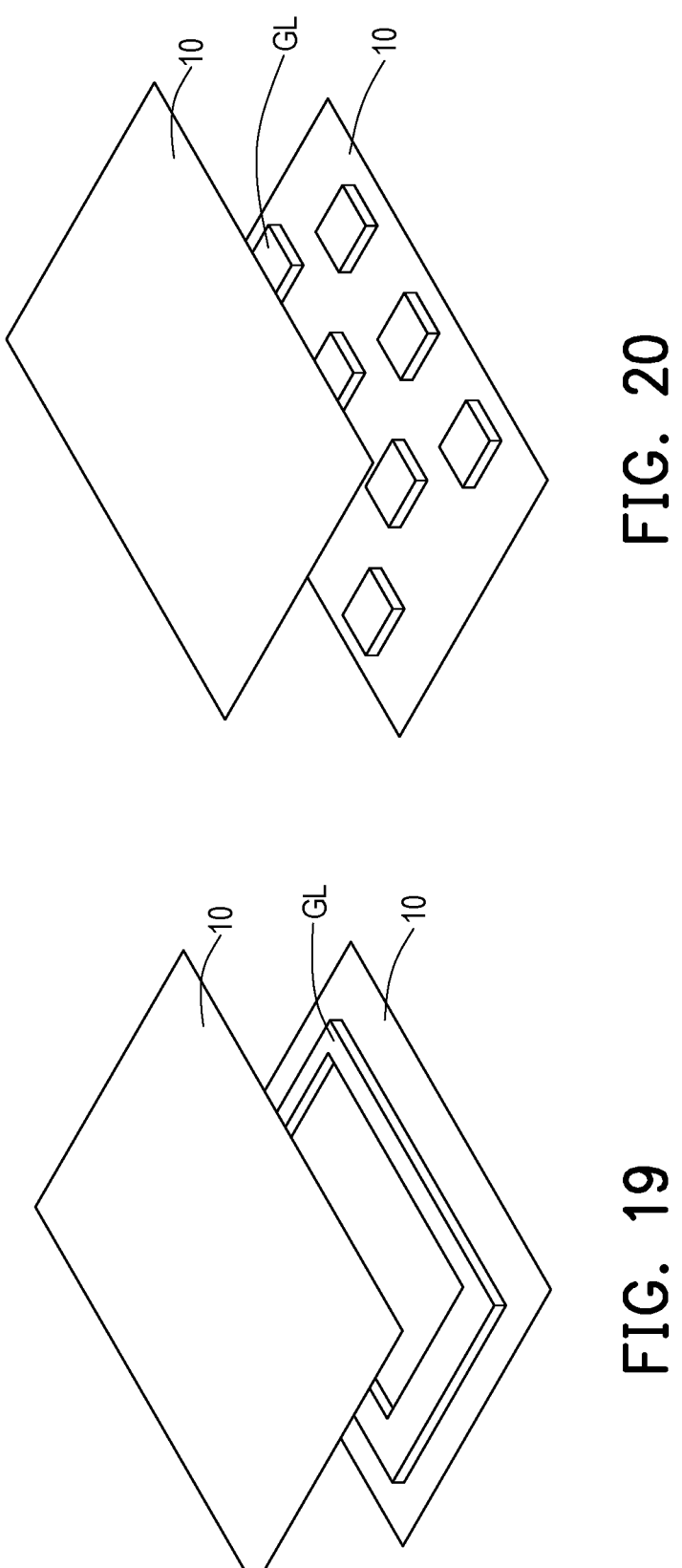
FIGS. 19 to 20 are exploded schematic diagrams of an antenna device with stacked antenna modules according to some embodiments of the present invention.

Referring to FIG. 18, in this embodiment, the antenna device 9F includes two antenna modules 10 overlapped together. The stacking method of the antenna modules 10 in the antenna device 9F is similar to the stacking method of the antenna modules 10 in the antenna device 9 of FIG. 10. For related descriptions, please refer to the embodiment of FIG. 10 and will not be repeated here. In this embodiment, a spacer layer GL is disposed between two antenna modules 10 and is used to support the distance between the first substrate of one antenna module 10 (referring to FIG. 10) and the first substrate of another antenna module 10 (refer-ring to FIG. 10). Two anti-UV films AUF are attached to the outsides of the two antenna modules 10, respectively. In some embodiments, the spacer layer GL is a ring type, thereby an air gap is included between the first substrate of one antenna module 10 (referring to FIG. 10) and the first substrate of another antenna module 10 (referring to FIG. 10), as shown in FIG. 19. In some embodiments, the spacer layer GL includes a plurality of island-shaped bump struc-tures, thereby an air gap is included between the first substrate of one antenna module 10 (referring to FIG. 10) and the first substrate of another antenna module 10 (refer-ring to FIG. 10), as shown in FIG. 20.

Figure 21:
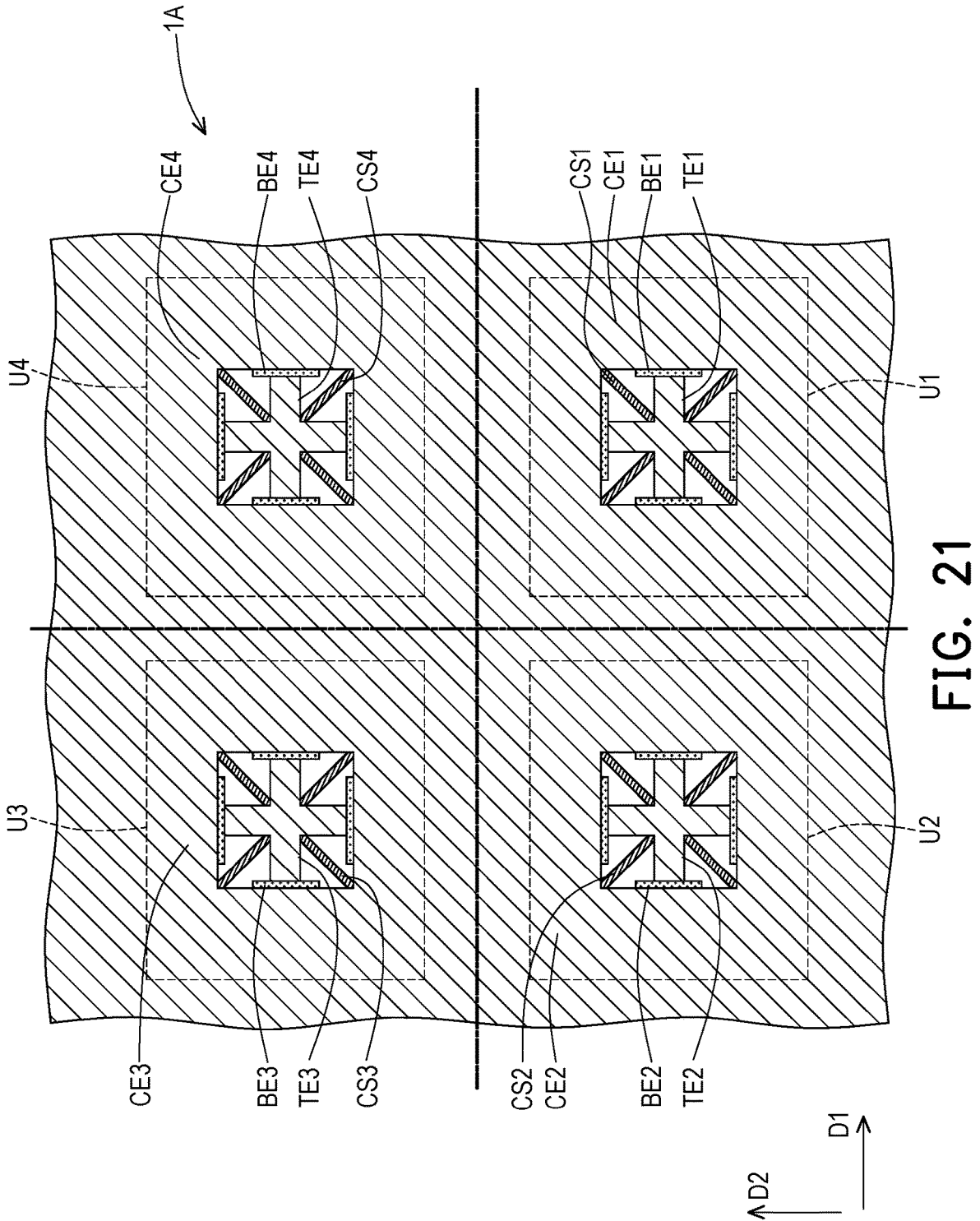
FIG. 21 is a schematic top view of an antenna device according to an embodiment of the present invention.

FIG. 21 is a schematic cross-sectional view of an antenna device 1A according to an embodiment of the present invention. It should be noted herein that, in embodiments provided in FIG. 21, element numerals and partial content of the embodiments provided in FIG. 1 to FIG. 9 are followed, the same or similar reference numerals being used to rep-resent the same or similar elements, and description of the same technical content being omitted. For a description of an omitted part, reference may be made to the foregoing embodiment, and the descriptions thereof are omitted herein.

The main difference between the embodiment in FIG. 21 and the embodiments in FIGS. 1 to 9 is that: in the antenna units of FIGS. 1 to 9, the first to fourth upper antenna electrodes TE1 to TE4 are in the form of a cross-shaped annular. However, in the antenna unit of FIG. 21, the first to fourth upper antenna electrodes TE1 to TE4 are in the form of a solid cross, and the first to fourth connection structures CS1 to CS4 are radially arranged to respectively connect the first to fourth upper antenna electrodes TE1 to TE4 to the first to fourth common electrodes CE1 to CE4. In this embodiment, the first to fourth common electrodes CE1 to CE4 are integrated as one, but the invention is not limited thereto. In other embodiments, the first to fourth common electrodes CE1 to CE4 are separated from each other and are electrically connected together through other conductive structures.

In addition, in this embodiment, the connection structure (e.g. the first to fourth connection structures CS1 to CS4) connects from the four corners of the opening of the common electrode (e.g. the first to fourth common electrodes CE1 to CE4) to the corners near the cross position of the cross-shaped upper antenna electrode (e.g. the first to fourth upper antenna electrodes TE1 to TE4). Through this setting, the frequency of the antenna signal can be adjusted by changing the electrical impedance of the connection structure. For example, when the connection structure includes high electrical impedance materials (such as indium tin oxide, thin metal or other similar materials), the antenna signal is not easy to transmit on the connection structure, making the antenna signal tend to be a low-frequency signal. On the other hand, when the connection structure includes low electrical impedance materials (such as thick metal or other similar materials), the antenna signal is easy to transmit on the connection structure, making the antenna signal tend to be a high-frequency signal. In other words, through the setting of such connection structure, the antenna unit can be matched to different frequency antenna signals by adjusting the material or thickness of the connection structure.

To sum up, by making the transistor array and its control circuit in the antenna unit symmetrically arranged, it is possible to avoid the antenna signal penetrating through the antenna unit from having different impacts on the electromagnetic wave signal with different polarization directions caused by an asymmetric transistor array and its control circuit.

What is claimed is:

1. An antenna device, comprising:
a first substrate;
a first antenna unit, disposed above the first substrate, and comprising:
    a first transistor;
    a first lower antenna electrode, electrically connected to the first transistor; and
    a first upper antenna electrode, at least partially overlapping with the first lower antenna electrode;
a second antenna unit, disposed above the first substrate, and comprising:
    a second transistor, wherein a gate electrode, a source electrode and a drain electrode of the first transistor are respectively symmetrical to a gate electrode, a source electrode and a drain electrode of the second transistor;
    a second lower antenna electrode, electrically connected to the second transistor; and
    a second upper antenna electrode, at least partially overlapping with the second lower antenna electrode.

2. The antenna device of claim 1, wherein the first lower antenna electrode is symmetrical to the second lower antenna electrode.

3. The antenna device of claim 1, wherein the gate electrode, the source electrode and the drain electrode of the first transistor are respectively mirror symmetrical to the gate electrode, the source electrode and the drain electrode of the second transistor based on an external mirror symmetry axis.

4. The antenna device of claim 3, wherein the first lower antenna electrode is mirror symmetrical to the second lower antenna electrode based on the external mirror symmetry axis.

5. The antenna device of claim 1, wherein the first antenna unit comprises: a third transistor, wherein a gate electrode, a source electrode and a drain electrode of the third transistor are respectively mirror symmetrical to the gate electrode, the source electrode and the drain electrode of the first transistor based on an internal mirror symmetry axis.

6. The antenna device of claim 1, wherein the first lower antenna electrode has a mirror symmetry structure based on an internal mirror symmetry axis.

7. The antenna device of claim 1, wherein the second antenna unit comprises: a fourth transistor, wherein a gate electrode, a source electrode and a drain electrode of the fourth transistor are respectively mirror symmetrical to the gate electrode, the source electrode and the drain electrode of the third transistor based on an external mirror symmetry axis.

8. The antenna device of claim 1, wherein the gate electrode, the source electrode and the drain electrode of the first transistor are configured to have a rotational symmetry with the gate electrode, the source electrode and the drain electrode of the second transistor based on an external rotational symmetry axis.

9. The antenna device of claim 1, wherein the first antenna unit comprises: a third transistor, wherein a gate electrode, a source electrode and a drain electrode of the third transistor are configured to have a rotational symmetry with the gate electrode, the source electrode and the drain electrode of the first transistor based on an internal rotational symmetry axis.

10. The antenna device of claim 1, wherein the first lower antenna electrode has a rotationally symmetric structure based on an internal rotational symmetry axis.

11. The antenna device of claim 1, wherein the gate of the first transistor and the gate of the second transistor are electrically connected to each other through a scan line.

12. The antenna device of claim 1, further comprises:
a metal mesh structure, electrically connected with the first upper antenna electrode and the second upper antenna electrode.

13. The antenna device of claim 12, further comprises:
a barrier layer, overlapping with the first transistor in a normal direction of a top surface of the first substrate, wherein the barrier layer and the first upper antenna electrode belong to a same layer.

14. The antenna device of claim 1, further comprises:
a second substrate, wherein the first antenna unit and the second antenna unit are located between the first substrate and the second substrate;
a third substrate and a fourth substrate:
a third antenna unit, disposed between the third substrate and the fourth substrate, wherein the third antenna unit comprises:
    a third transistor;
    a third lower antenna electrode, electrically connected to the third transistor; and
    a third upper antenna electrode, at least partially overlapping with the third lower antenna electrode, wherein the gate electrode, the source electrode and the drain electrode of the first transistor are respectively overlapping with a gate electrode, a source electrode and a drain electrode of the third transistor; and a spacer layer, supporting a distance between the first substrate and the third substrate so that there is an air gap between the first substrate and the third substrate.

15. The antenna device of claim 1, wherein the first antenna unit further comprises a first common electrode surrounding the first upper antenna electrode, the second antenna unit further comprises a second common electrode surrounding the second upper antenna electrode wherein the first common electrode and the second common electrode are integrated as one.

16. The antenna device of claim 1, wherein the first antenna unit further comprises a first common electrode surrounding the first upper antenna electrode, the second antenna unit further comprises a second common electrode surrounding the second upper antenna electrode, and the first common electrode and the second common electrode are electrically connected to each other through a conductive line structure.

17. The antenna device of claim 1, wherein the first lower antenna electrode comprises a plurality of strip structures or a plurality of L-shaped structures.

\* \* \* \* \*